US012772804B2

(12) United States Patent
Cho et al.

(10) Patent No.: US 12,772,804 B2
(45) Date of Patent: Oct. 20, 2026

(54) TEST LINE STRUCTURE FOR INTEGRATED CHIP COMPRISING OPTICAL DEVICES

(71) Applicant: Taiwan Semiconductor Manufacturing Company, Ltd., Hsinchu (TW)

(72) Inventors: Lan-Chou Cho, Hsinchu City (TW); Chewn-Pu Jou, Hsinchu (TW); Stefan Rusu, Sunnyvale, CA (US); Cheng-Tse Tang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 613 days.

(21) Appl. No.: 18/312,718

(22) Filed: May 5, 2023

(65) Prior Publication Data

US 2024/0371710 A1 Nov. 7, 2024

(51) Int. Cl.

| | |
|---|---|
| ***H10P 74/00*** | (2026.01) |
| ***G02B 6/42*** | (2006.01) |
| ***G02B 6/43*** | (2006.01) |
| ***H10P 14/40*** | (2026.01) |
| ***H10P 50/00*** | (2026.01) |
| ***H10P 50/26*** | (2026.01) |
| ***H10P 50/66*** | (2026.01) |
| ***H10P 52/40*** | (2026.01) |
| ***H10P 74/20*** | (2026.01) |
| ***H10W 74/01*** | (2026.01) |

(52) U.S. Cl.

CPC .......... *H10P 74/273* (2026.01); *G02B 6/4274* (2013.01); *G02B 6/43* (2013.01); *H10P 14/412* (2026.01); *H10P 50/266* (2026.01); *H10P 50/667* (2026.01); *H10P 50/73* (2026.01); *H10P 52/403* (2026.01); *H10W 74/01* (2026.01); *H10P 74/203* (2026.01); *H10P 74/207* (2026.01)

(58) Field of Classification Search

None

See application file for complete search history.

(56) References Cited

U.S. PATENT DOCUMENTS

| | | | | |
|---|---|---|---|---|
| 2007/0241766 | A1 * | 10/2007 | Kamitai ............ | G01R 31/2884 324/762.05 |
| 2017/0110201 | A1 | 4/2017 | Lien et al. | |
| 2017/0110202 | A1 | 4/2017 | Wu et al. | |
| 2017/0125309 | A1 | 5/2017 | Lee et al. | |
| 2022/0384279 | A1 | 12/2022 | Lin et al. | |

* cited by examiner

*Primary Examiner* — Alexander G Ghyka

(74) *Attorney, Agent, or Firm* — Eschweiler & Potashnik, LLC

(57) ABSTRACT

Various embodiments of the present disclosure are directed towards an integrated chip including a test line structure disposed on a semiconductor workpiece. The test line structure includes a plurality of optical input/output (I/O) structures disposed within and/or on the semiconductor workpiece. The test line structure further includes a plurality of electrical I/O structures on the semiconductor workpiece. The plurality of optical I/O structures and the plurality of electric I/O structures are laterally spaced from one another along a line extending in a first direction.

20 Claims, 19 Drawing Sheets

TEST LINE STRUCTURE FOR INTEGRATED CHIP COMPRISING OPTICAL DEVICES

BACKGROUND

Modern day integrated chips comprise millions or billions of semiconductor devices formed on a semiconductor workpiece (e.g., silicon substrate). Prior to packaging the semiconductor workpiece, the semiconductor devices on the workpiece are tested for functional defects. For example, a wafer acceptance test (WAT) is a test in which a wafer prober sends electrical and/or optical signal test signals to the semiconductor devices. The electrical and/or optical signal test signals check the functionality of the semiconductor devices and identify devices that fail to meet design specifications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
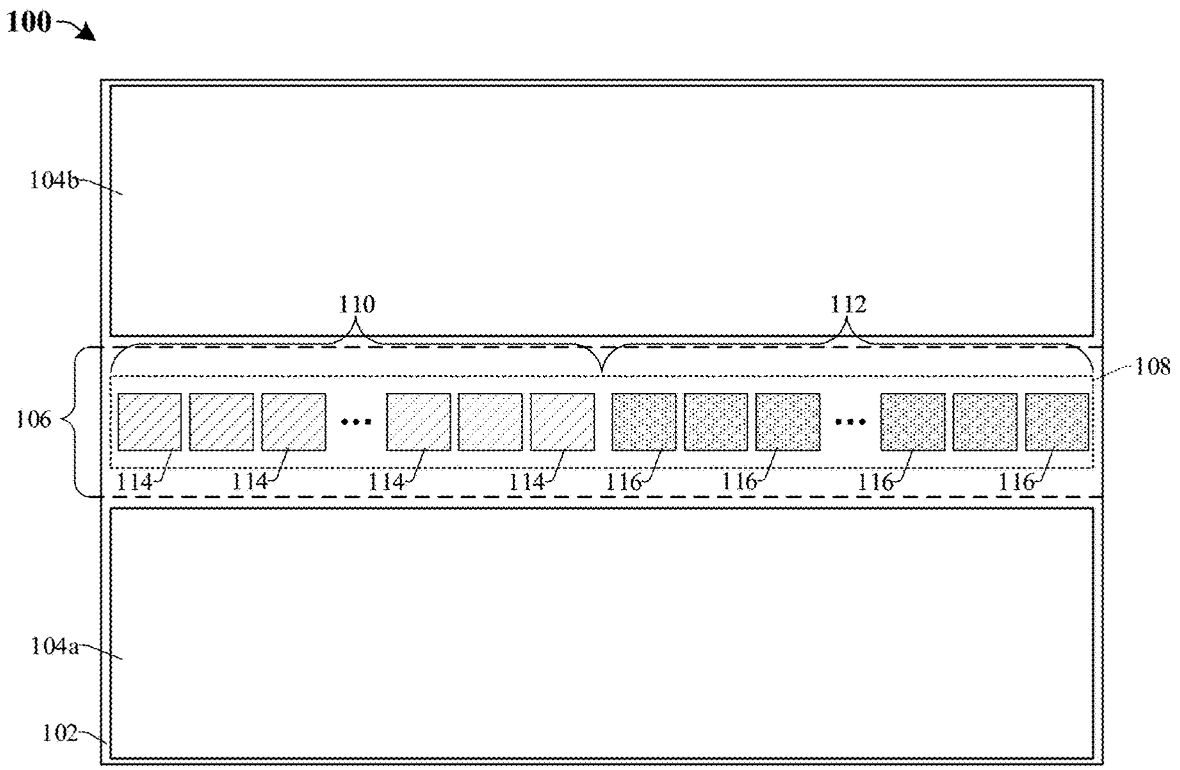
FIG. 1 illustrates a block diagram of some embodiments of an integrated chip comprising a test line structure having a plurality of optical input/output (I/O) structures laterally adjacent to a plurality of electrical I/O structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may comprise test line structures that have electrical input/output (I/O) structures configured to receive electrical test signals from a wafer prober and to provide the electrical test signals to different parts of an integrated chip to test its functionality. For example, probes of a wafer prober may physically contact an electrical I/O structure to provide an electrical test signal to the electrical I/O structure. The electrical I/O structure provides the electrical test signal to devices on the integrated chip, so that tests can be carried out on the devices at intermediate manufacturing stages. This allows a fabrication process to be accurately characterized so problems can be quickly identified and resolved. It also allows defective wafers to be discarded early in the fabrication process to help improve fabrication throughput.

As integrated chips continue to decrease in size, optical devices (e.g., photonic devices) may be increasingly utilized in the integrated chips to enable the semiconductor industry to continue to improve integrated chip performance over traditional integrated chips (e.g., since photons can provide a higher bandwidth than electrons used in conventional integrated chips). Optical devices may be utilized in integrated chips for many applications including communication, information processing, optical computing, etc. The optical devices may use light waves (e.g., produced by lasers or light sources) for data processing, data storage, and/or data communication. While electrical I/O structures in test line structures of the integrated chip may test some electrical functionality of the optical devices, the electrical I/O structures may not provide optical test signals to the optical devices. An inability to supply optical test signals to different parts of the integrated chip significantly reduces testing functionality of the optical devices on the integrated chip. As a result, accurate characterization of the optical devices during fabrication is reduced. Further, identification of wafers with a high number of defective optical devices may not be accurately determined, thereby decreasing fabrication throughput.

Accordingly, in some embodiments, the present disclosure relates to an integrated chip having a test line structure that comprises a plurality of optical input/output (I/O) structures laterally adjacent to a plurality of electrical I/O structures disposed within a test line region. In some embodiments, the optical I/O structures are disposed on a semiconductor workpiece (e.g., a semiconductor substrate, a semiconductor wafer, etc.). Further, an interconnect structure overlies the semiconductor workpiece and the electric I/O structures are disposed on the interconnect structure. One or more optical devices are disposed on and/or within the semiconductor workpiece. The plurality of electrical I/O structures and the plurality of optical I/O structures are respectively configured to receive one or more electrical test signals and one or more optical test signals from a wafer prober and/or a control circuit. The plurality of optical I/O structures are configured to provide the one or more optical test signals to the one or more optical devices and the plurality of electrical I/O structures are configured to provide the electrical test signals to the one or more optical devices. One or more output test signals may be generated from the one or more optical devices in response to the one or more optical and electrical test signals. The one or more output test signals may be provided to the wafer prober and/or the control circuit by way of one or more of the electrical and/or optical I/O structures. As a result, accurate characterization of the one or more optical devices during fabrication is increased. Further, identification of a semiconductor workpiece with a high number of defective optical devices may be accurately determined, thereby allowing defective semiconductor workpieces to be discarded early in the fabrication process. This may increase fabrication throughput and/or device yield.

FIG. 1 illustrates a block diagram 100 of some embodiments of an integrated chip comprising a test line structure 108 having a plurality of optical input/output (I/O) structures 114 laterally adjacent to a plurality of electrical I/O structures 116.

In some embodiments, the integrated chip comprises a first semiconductor die 104*a*, a second semiconductor die 104*b*, and the test line structure 108 disposed laterally between the first and second semiconductor dies 104*a-b*. The first and second semiconductor dies 104*a-b* are disposed on a semiconductor workpiece 102. The semiconductor workpiece 102 may, for example, be or comprise a semiconductor substrate (e.g., a silicon substrate, a semiconductor-on-insulator (SOI) substrate, etc.), a semiconductor wafer (e.g., a silicon wafer), or the like. The first and second semiconductor dies 104*a-b* each comprise a device region comprising one or more semiconductor devices (e.g., transistors, optical devices such as photodetector(s), optical modulator(s), optical interferometer(s), waveguide(s), etc.) disposed within and/or on the semiconductor workpiece 102. In various embodiments, the test line structure 108 is disposed laterally within a test line region 106 spaced laterally between the first and second semiconductor dies 104*a-b*.

In various embodiments, the test line structure 108 comprises the plurality of optical I/O structures 114 and the plurality of electrical I/O structures 116 laterally adjacent to one another. The plurality of optical I/O structures 114 are disposed within an optical test region 110 of the test line structure 108 and the plurality of electrical I/O structures 116 are disposed within an electrical test region 112 of the test line structure 108. One or more optical devices (e.g., photodetector(s), optical modulator(s), optical interferometer(s), waveguide(s), etc.) (not shown) are disposed within and/or on the semiconductor workpiece 102. In some embodiments, the one or more optical devices are disposed within the first semiconductor die 104*a*, the second semiconductor die 104*b*, and/or the test line structure 108. The plurality of optical I/O structures 114 are configured to receive one or more optical test signals and the plurality of electrical I/O structures 116 are configured to receive one or more electrical test signals. For example, the optical I/O structures 114 and the electrical I/O structures 116 may receive corresponding optical and electrical test signals from a wafer prober and/or a control circuit (not shown). The plurality of optical I/O structures 114 and the plurality of electrical I/O structures 116 are configured to convey the one or more optical and electrical test signals to the one or more optical devices to characterize performance of the one or more optical devices. Because the test line structure 108 comprises both the optical I/O structures 114 and the electrical I/O structures 116, accurate characterization of the one or more optical devices during fabrication of the integrated chip may be achieved. This facilitates verifying that the one or more optical devices meet design specifications and function properly. Further, a semiconductor workpiece with a high number of defective optical devices may be identified early in the fabrication process to improve fabrication throughput.

In various embodiments, a wafer acceptance test (WAT) may be performed on the integrated chip before performing a dicing processing and/or a packaging process on the integrated chip. In some embodiments, the WAT includes utilizing a wafer prober (e.g., having both optical and electrical testing capabilities) to send one or more input optical test signals and/or one or more input electrical test signals to the one or more optical devices by way of the optical I/O structures 114 and the electrical I/O structures 116. Output electrical and/or optical test signals generated by the one or more optical devices in response to the input optical and/or electrical test signals may be sent to the wafer prober and/or a control circuit (not shown) by way of the optical I/O structures 114 and the electrical I/O structures 116 to characterize performance of the one or more optical devices. As a result, functionality of the one or more optical devices may be verified. In further embodiments, a semiconductor workpiece with a high number of optical devices that fail to meet design specifications may be discarded before performing a dicing processing and/or a packaging process.

In some embodiments, the plurality of optical I/O structures 114 may each be configured as a grating coupler or some other suitable optical I/O structure. In yet further embodiments, the plurality of electrical I/O structures 116 may each be configured as a conductive bond pad, a conductive contact pad, a conductive wire, a conductive line, or some other suitable electrical I/O structure.

Figure 2:
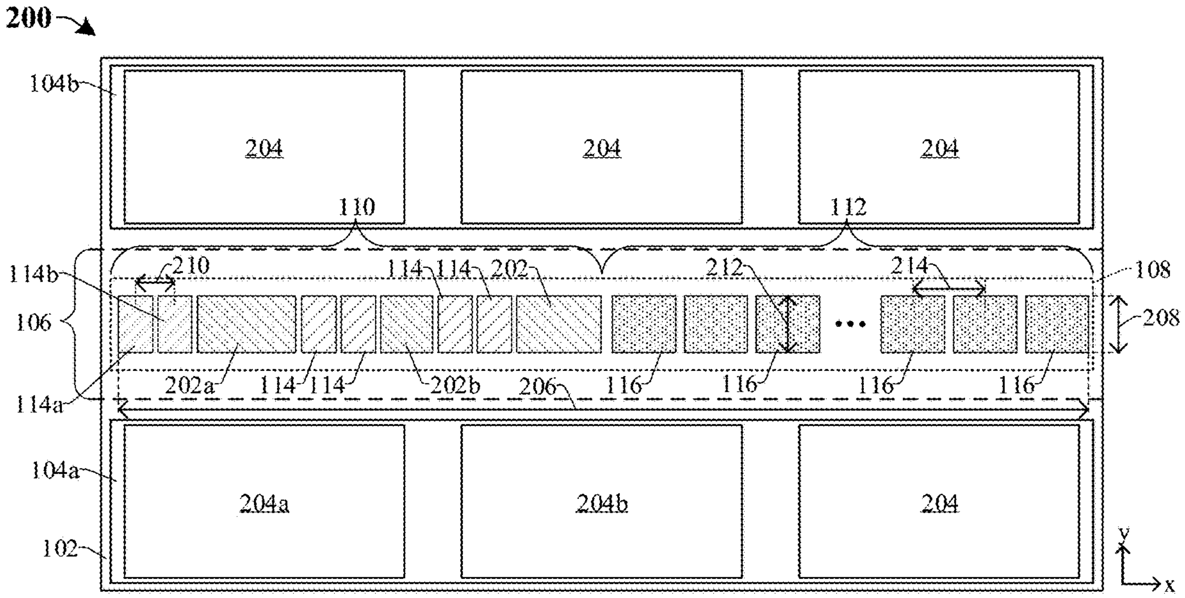
FIG. 2 illustrates a block diagram of some embodiments of an integrated chip comprising a test line structure having a plurality of optical I/O structures, a plurality of electrical I/O structures, and one or more optical devices.

FIG. 2 illustrates some embodiments of a block diagram 200 of an integrated chip having a test line structure 108 comprising a plurality of optical I/O structures 114, a plurality of electrical I/O structures 116, and one or more optical devices 202.

In some embodiments, the first and second semiconductor dies 104*a-b* respectively comprise a plurality of device regions 204 that respectively comprise one or more semiconductor devices. For example, the one or more semiconductor devices comprise optical devices such as photodetector(s), optical modulator(s), optical interferometer(s), waveguide(s), grating coupler(s), some other suitable semiconductor device, or any combination of the foregoing. In various embodiments, the plurality of device regions 204 of the first semiconductor die 104*a* comprises a first device region 204*a* that may comprise one or more optical modulators and a second device region 204*b* that may comprise one or more photodetectors. In various embodiments, the test line structure 108 comprises the plurality of optical I/O structures 114, the plurality of electrical I/O structures 116, and one or more optical devices 202 disposed within a test line region 106. The one or more optical devices 202 are disposed within the optical test region 110 of the test line structure 108. In various embodiments, the one or more optical devices 202 of the test line structure 108 are respectively configured to receive one or more optical test signals from the plurality of optical I/O structures 114 and one or more electrical test signals from the plurality of electrical I/O structures 116.

In some embodiments, the one or more optical devices 202 comprises a first optical device 202*a* that is laterally adjacent to a pair of optical I/O structures 114*a-b* in the plurality of optical I/O structures 114. A first optical I/O structure 114*a* in the pair of optical I/O structures 114*a-b* is configured to provide an input optical test signal to the first optical device 202*a*. A second optical I/O structure 114*b* in the pair of optical I/O structures 114*a-b* is configured to receive an output optical test signal from the first optical device 202*a*. In yet further embodiments, at least one electrical I/O structure in the plurality of electrical I/O structures 116 may be electrically coupled to the first optical device 202*a* and is configured to provide an input electrical test signal to the first optical device 202*a*. In such embodiments, the output optical test signal is generated by the first optical device 202*a* based on the input optical test signal and the input electrical test signal. In various embodiments, the input optical and electrical test signals may be provided by a wafer prober and/or a control circuit (not shown) and the output optical test signal may be provided to the wafer prober and/or the control circuit to characterize a performance and/or functionality of the first optical device 202*a*. In various embodiments, the plurality of optical I/O structures 114, the one or more optical devices 202, and the plurality of electrical I/O structures 116 are disposed along a line extending in a first direction (e.g., along the x-axis) and disposed directly between the first and second semiconductor dies 104*a-b*.

Figure 17:
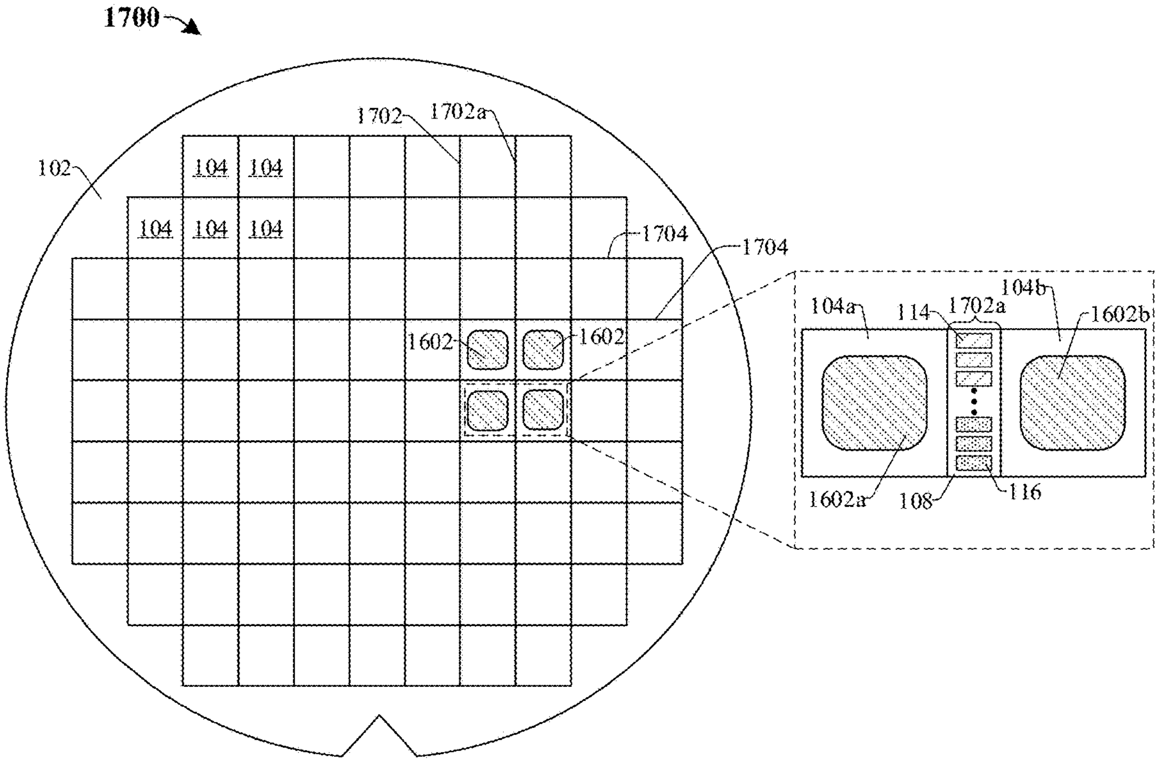
FIG. 17 illustrates a top view of some embodiments of an integrated chip comprising one or more test line structures disposed between adjacent semiconductor dies.

In some embodiments, the test line structure 108 may be located within a scribe line arranged between the first and second semiconductor dies 104*a*, 104*b*, where the semiconductor workpiece 102 is configured as a semiconductor wafer (e.g., as illustrated and/or described in FIG. 17). In such embodiments, the scribe line is removed during dicing of the semiconductor workpiece 102 to singulate the first and second semiconductor dies 104*a*, 104*b*. In other embodiments, the test line structure 108 may be located within the first semiconductor die 104*a* or the second semiconductor die 104*b* at a location outside of a scribe line (not shown). In such embodiments, the test line structure 108 is present on the first semiconductor die 104*a* or the second semiconductor die 104*b* after singulation (i.e., dicing) is completed. In yet other embodiments, the test line structure 108 may be integrated within any area of the integrated chip (e.g., within any one of the device regions 204 of the first or second semiconductor dies 104*a*, 104*b*) (not shown).

The test line structure 108 has a test line length 206 that may be defined between an outermost optical I/O structure in the plurality of optical I/O structures 114 and an outermost electrical I/O structure in the plurality of electrical I/O structures 116. Further the test line structure 108 has a test line width 208. In various embodiments, the test line width 208 is within a range of about 20 to about 240 micrometers (um) or some other suitable value. In yet further embodiments, the test line length 206 is within a range of about 1 to about 20 millimeters (mm) or some other suitable value. In some embodiments, by virtue of the test line length 206 being 20 mm or less and/or the test line width 208 being 240 um or less, an area of the test line structure 108 over the semiconductor workpiece 102 is reduced thereby increasing an area over and/or on the semiconductor workpiece 102 for semiconductor devices disposed within other regions of the semiconductor workpiece 102 (e.g., disposed within the first and second semiconductor dies 104*a-b*).

In various embodiments, a spacing 210 between adjacent optical I/O structures in the plurality of optical I/O structures 114 is within a range of about 100 to 250 um or some other suitable value. Further, a number of optical I/O structures 114 disposed within the test line structure 108 may be within a range of 1 to 64 or some other suitable number of optical I/O structures. In some embodiments, a width 212 of the electrical I/O structures 116 is within a range of about 20 to 240 um or some other suitable value. In further embodiments, a spacing 214 between adjacent electrical I/O structures in the plurality of electrical I/O structures 116 is within a range of about 50 to 150 um or some other suitable value. Further, a number of electrical I/O structures 116 disposed within the test line structure 108 may be within a range of 1 to 64 or some other suitable number of electrical I/O structures.

Figure 3:
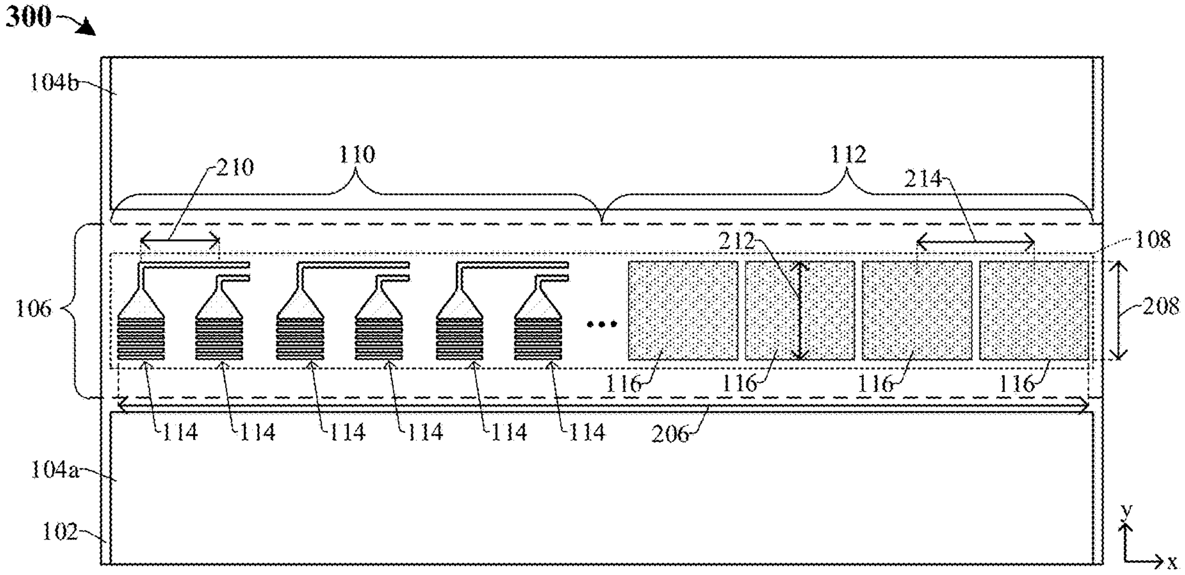
FIGS. 3-5 illustrate various block diagrams of some other embodiments of the integrated chip of FIG. 1.

FIG. 3 illustrates a block diagram 300 of some embodiments of an integrated chip corresponding to some other embodiments of the integrated chip of FIG. 2, in which the plurality of optical I/O structures 114 are respectively configured as a grating coupler optically coupled to a corresponding waveguide. In various embodiments, the waveguides optically coupled to corresponding optical I/O structures 114 are respectively configured to carry optical signals in a direction (e.g., along the x-axis) towards the plurality of electrical I/O structures 116.

Figure 4:
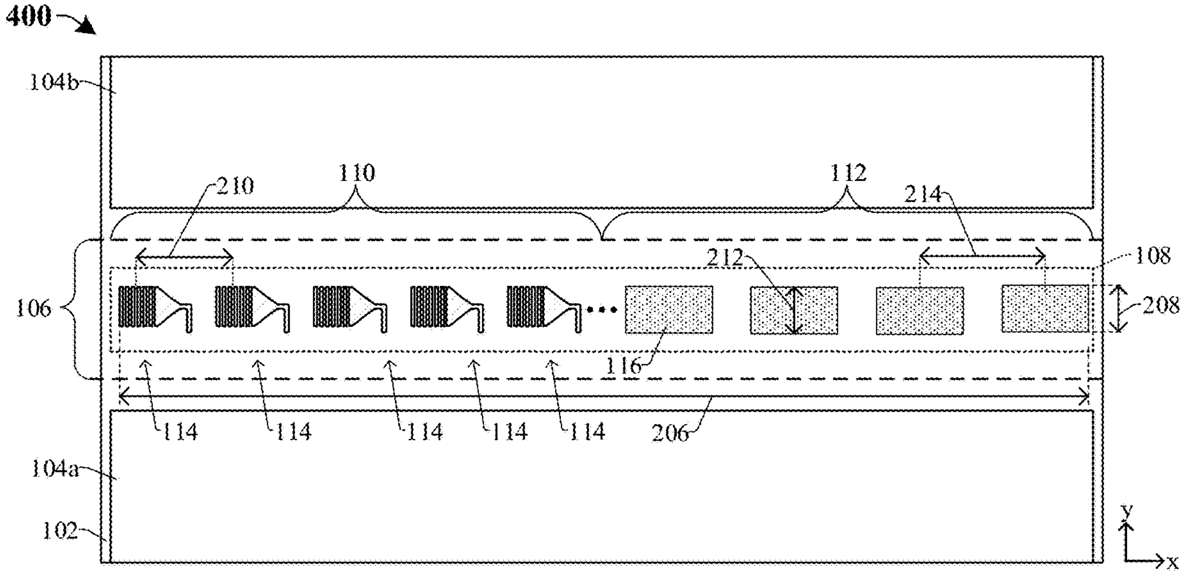

FIG. 4 illustrates a block diagram 400 of some embodiments of an integrated chip corresponding to some other embodiments of the integrated chip of FIG. 2, in which the plurality of optical I/O structures 114 are respectively configured as a grating coupler optically coupled to a corresponding waveguide. In various embodiments, the waveguides optically coupled to corresponding optical I/O structures 114 are respectively configured to carry optical signals in a direction (e.g., along the y-axis) away from the plurality of electrical I/O structures 116.

Figure 5:
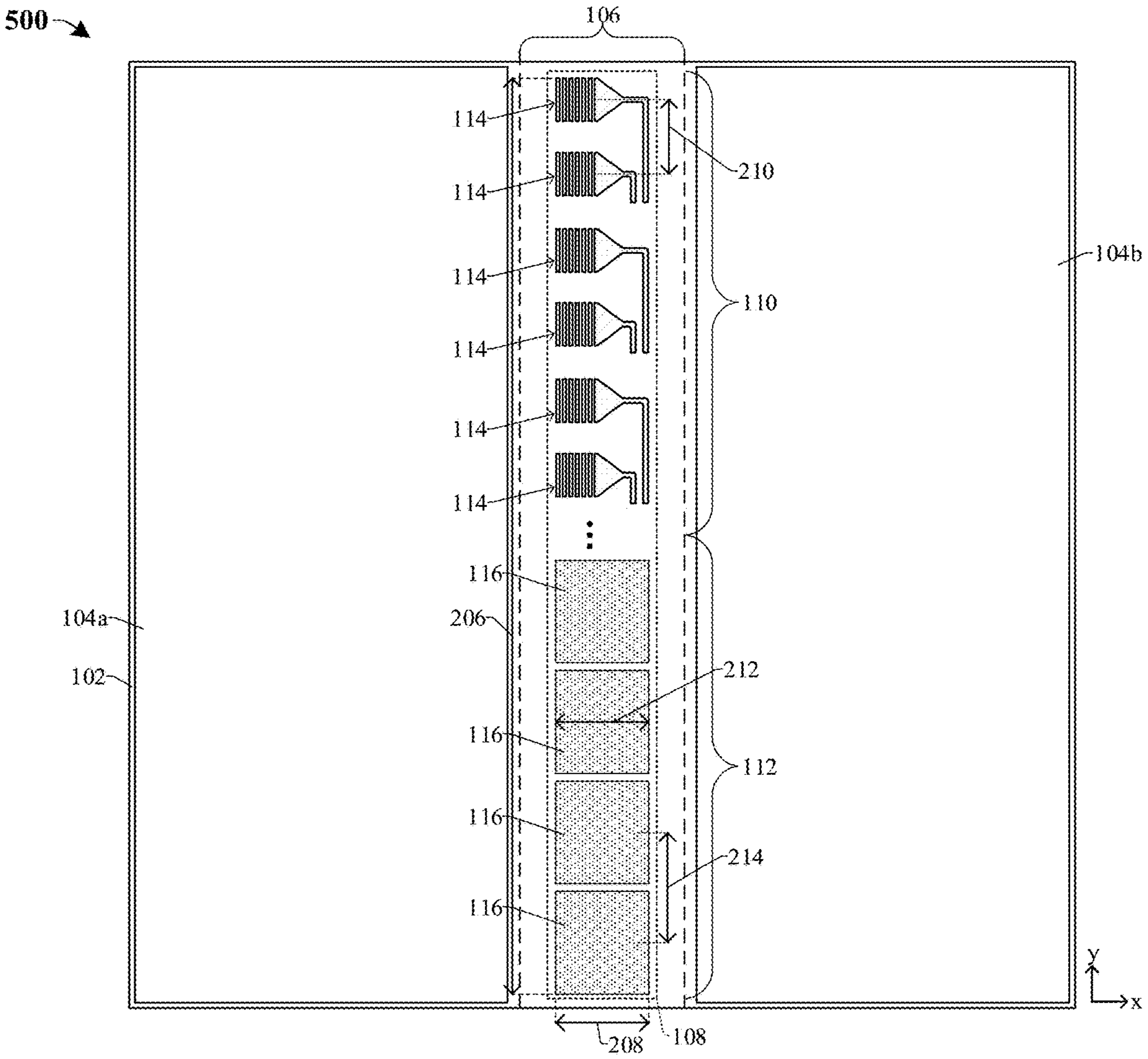

FIG. 5 illustrates a block diagram 500 of some embodiments of an integrated chip corresponding to some other embodiments of the integrated chip of FIG. 2, where the test line structure 108 is disposed along a line extending in a section direction (e.g., along the y-axis) and is spaced between the first and second semiconductor dies 104*a-b*.

Figure 6A:
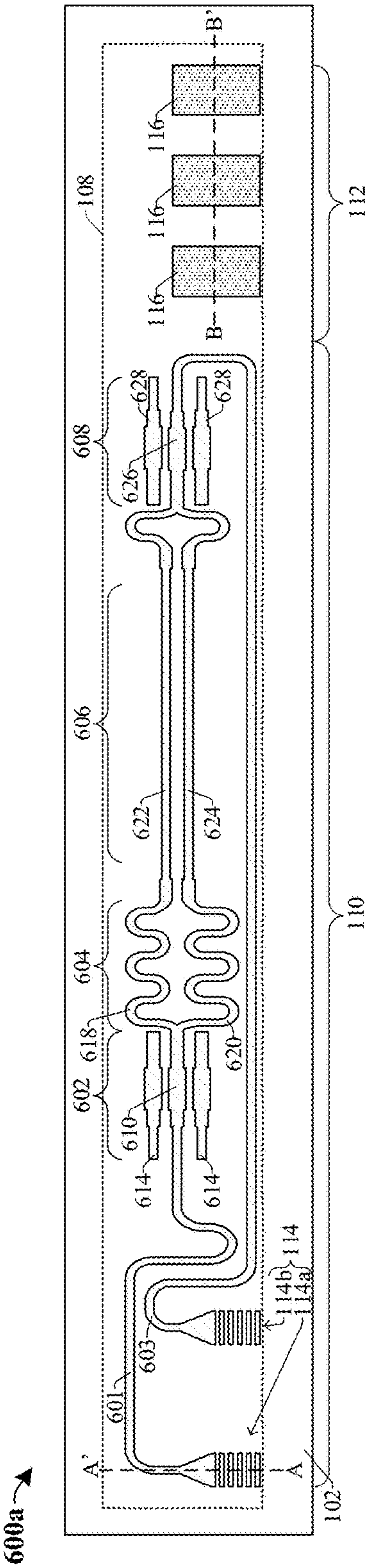
FIGS. 6A and 6B illustrate various views of some embodiments of an integrated chip comprising a test line structure having a plurality of optical I/O structures, a plurality of electrical I/O structures, and a plurality of optical devices.

FIG. 6A illustrates a top view 600*a* of some embodiments of an integrated chip having a test line structure 108 comprising a plurality of optical I/O structures 114, a plurality of electrical I/O structures 116, and a plurality of optical devices 602-608. In various embodiments, the test line structure 108 of FIGS. 1-5 may be configured as the test line structure 108 is illustrated and/or described in FIG. 6A.

In some embodiments, the test line structure 108 comprises the plurality of optical I/O structures 114 and the plurality of optical devices 602-608 disposed within the optical test region 110 and the plurality of electrical I/O structures 116 disposed within the electrical test region 112. The plurality of optical I/O structures 114 comprises a first optical I/O structure 114*a* laterally adjacent to a second I/O structure 114*b*. The plurality of optical devices 602-608 are spaced laterally between the first and second optical I/O structures 114*a-b* and the plurality of electrical I/O structures 116. The first optical I/O structure 114*a* is optically coupled to a first waveguide 601. In some embodiments, the first optical I/O structure 114*a* is configured to receive one or more input optical test signals (e.g., from a wafer prober and/or a control circuit) and provide the one or more input optical test signals to the first waveguide 601. The first waveguide 601 is configured to carry or transmit the one or more input optical test signals to the plurality of optical devices 602-608. In various embodiments, the plurality of optical devices 602-608 comprises a first optical device 602, a second optical device 604, a third optical device 606, and a fourth optical device 608.

In some embodiments, the first optical device 602 is configured as or comprises an optical beam splitter 610 that is configured to split an input optical test signal provided by the first waveguide 601 and/or the first optical I/O structure 114*a* into a first optical signal and a second optical signal. In yet further embodiments, the first optical device 602 further comprises dummy optical beam splitters 614 disposed on opposing sides of the optical beam splitter 610. The first optical device 602 is optically coupled to the second optical device 604. In various embodiments, the second optical device 604 is configured as or comprises a Mach-Zehnder interferometer (MZI) that comprises a first MZI waveguide 618 and a second MZI waveguide 620. In such embodiments, a light path (e.g., overall length) of the first MZI waveguide 618 is different from (e.g., less than) a light path (e.g., overall length) of the second MZI waveguide 620. The first optical signal from the optical beam splitter 610 is provided to the first MZI waveguide 618 and the second optical signal from the optical beam splitter 610 is provided to the second MZI waveguide 620. The second optical device 604 is optically coupled to the third optical device 606.

In various embodiments, the third optical device 606 is configured as an optical modulator, a Mach-Zehnder modulator (MZM), or some other suitable device. The third optical device 606 comprises a first modulator waveguide 622 optically coupled to the first MZI waveguide 618 and a second modulator waveguide 624 optically coupled to the second MZI waveguide 620. The third optical device 606 is configured to receive the first and second optical signals from the second optical device 604 and apply one or more phase shifts to the first and/or second optical signals. In various embodiments, the third optical device 606 comprises one or more doped regions (e.g., disposed along the first and/or second modulator waveguides 622, 624) (as illustrated and/or described in FIGS. 7A-8B) configured to adjust characteristics (e.g., adjust refractive indices) of the first and/or second modulator waveguides 622, 624. Bias voltages may be applied to the one or more doped regions by way of the electrical I/O structures 116 to introduce a phase shift along the first and/or second modulator waveguides 622, 624. In some embodiments, the fourth optical device 608 is configured as or comprises an optical beam combiner 626 that is configured to combine optical signals from the third optical device 606 into an output optical test signal. In some embodiments, the fourth optical device 608 further comprises dummy optical beam combiners 628 disposed on opposing sides of the optical beam combiner 626.

In various embodiments, the fourth optical device 608 is configured to combine the first and second optical signals from the first and second modulator waveguides 622, 624 into the output optical test signal. The output test optical signal may be transmitted or carried from the fourth optical device 608 via a second waveguide 603 to the second optical I/O structure 114*b*. In various embodiments, the output optical test signal may be output to the wafer prober and/or an output optical fiber by way of the second optical I/O structure 114*b*. Accordingly, the wafer prober and/or the control circuit may be configured to perform a comparison between the input optical test signal and the output optical test signal to characterize a performance and/or functionality of the plurality of optical devices 602-608. Because the test line structure 108 comprises the plurality of optical I/O structures 114, the plurality of optical devices 602-608, and the plurality of electrical I/O structures 116, accurate characterization and/or monitoring of performance of optical devices disposed on the semiconductor workpiece 102 may be achieved. This facilitates verifying that the optical devices meet designed specifications and function properly.

Figure 6B:
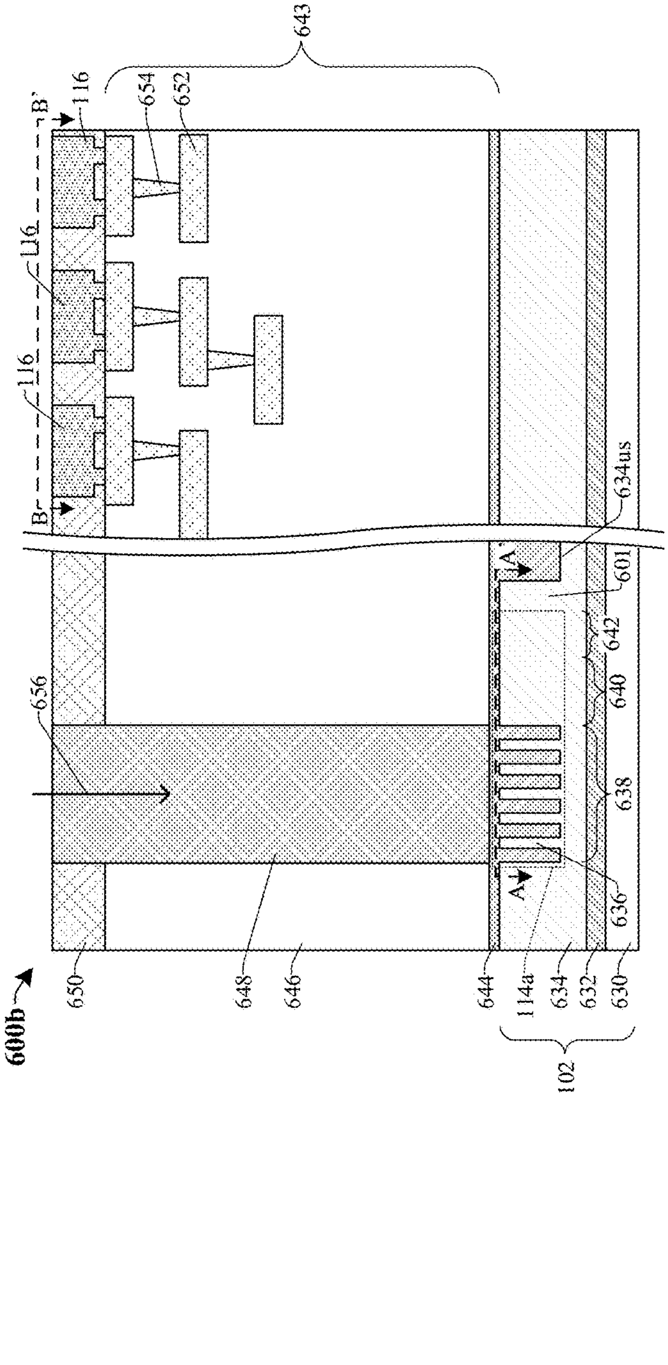

FIG. 6B illustrates a cross-sectional view 600*b* of some embodiments of portions of the integrated chip of FIG. 6A. In various embodiments, a first side of the cross-sectional view 600*b* may be taken along line A-A' of FIG. 6A and a second side of the cross-sectional view 600*b* may be taken along line B-B' of FIG. 6A.

In some embodiments, the semiconductor workpiece 102 is configured as a semiconductor-on-insulator (SOI) substrate comprising a base substrate 630 separated from an active layer 634 by an insulator structure 632. The active layer 634 may, for example, be or comprise silicon, polysilicon, some other suitable substrate material, or any combination of the foregoing. An interconnect structure 643 overlies the semiconductor workpiece 102. The interconnect structure 643 comprises an interconnect dielectric structure 646, a plurality of conductive wires 652, and a plurality of conductive vias 654. Further, a dielectric layer 644 may be disposed between the interconnect dielectric structure 646 and the active layer 634.

The first optical I/O structure 114*a* may be disposed within the active layer 634. In various embodiments, the first optical I/O structure 114*a* is configured as a grating coupler structure and comprises a base segment 638, a tapered segment 640 abutting the base segment 638, and a tip segment 642 abutting the tapered segment 640. In some embodiments, the base segment 638 comprises a plurality of grating coupler segments 636 laterally spaced from one another and a width of the tapered segment 640 continuously decreases when viewed from above from the base segment 638 in a direction towards the tip segment 642 (as seen in FIG. 6A). The tip segment 642 is disposed between the tapered segment 640 and the first waveguide 601. In yet further embodiments, the first optical I/O structure 114*a* continuously extends upward from an upper surface 634 us of the active layer 634. The dielectric layer 644 is disposed on and around the first optical I/O structure 114*a*. The dielectric layer 644 may, for example be or comprise silicon dioxide, a metal oxide, or some other suitable dielectric material. In various embodiments, the dielectric layer 644 may be configured as a cladding material for components of the test line structure (108 of FIG. 6A).

The interconnect structure 643 overlies the semiconductor workpiece 102 and the first optical I/O structure 114*a*. The conductive wires and vias 652, 654 are disposed within the interconnect dielectric structure 646 and are configured to provide electrical coupling between structures and/or devices disposed on the semiconductor workpiece 102. A passivation structure 650 overlies the interconnect structure 643. The plurality of electrical I/O structures 116 are disposed within the passivation structure 650 and directly overlie a topmost layer of conductive wires in the plurality of conductive wires 652. In some embodiments, the plurality of electrical I/O structures 116 are directly electrically coupled to one or more structures and/or devices of the test line structure (108 of FIG. 6A) by way of the interconnect structure 643. For example, the plurality of electrical I/O structures 116 may be electrically coupled to one or more doped regions of the third optical device (606 of FIG. 6A) by way of the interconnect structure 643. The plurality of electrical I/O structures 116 may, for example, respectively be or comprise titanium, aluminum, copper, tungsten, gold, silver, some other suitable material, or any combination of the foregoing. In various embodiments, the plurality of optical I/O structures (114 of FIG. 6A) comprise a first material (e.g., silicon) and the plurality of electrical I/O structures 116 comprise a second material (e.g., a metal such as aluminum, tungsten, gold, silver, copper, etc.) different from the first material. In further embodiments, the plurality of optical I/O structures (114 of FIG. 6A) are vertically spaced from the plurality of electrical I/O structures 116.

An optical I/O channel 648 is disposed within the passivation structure 650 and/or the interconnect dielectric structure 646 and directly overlies the first optical I/O structure 114*a*. In various embodiments, the optical I/O channel 648 may be optically coupled to an optical fiber a light pipe structure, or the like that is configured to transmit and/or receive an optical signal. In further embodiments, the optical I/O channel 648 is configured as an optical fiber waveguide, a light pipe structure, or the like. In some embodiments, the optical I/O channel 648 is configured to direct an optical signal 656 (e.g., an input optical test signal) towards the first optical I/O structure 114*a*, where the optical signal 656 is provided to the plurality of optical devices (602-608 of FIG. 6A) of the test line structure (108 of FIG. 6A) by way of the first optical I/O structure 114*a*.

Figure 7A:
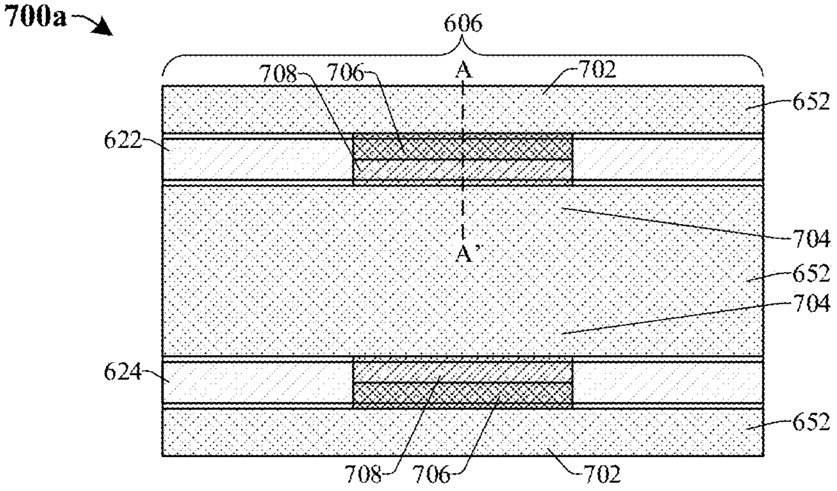
FIGS. 7A and 7B illustrate various views of some embodiments of an optical device that may be used in some embodiments of the test line structure.

FIG. 7A illustrates a top view 700*a* of some embodiments of the third optical device 606 of the integrated chip of FIG. 6A.

As shown in the top view 700*a*, the third optical device 606 is configured as an MZM, an optical modulator, or some other suitable device. In some embodiments, the third optical device 606 comprises the first modulator waveguide 622 and the second modulator waveguide 624. The first modulator waveguide 622 and the second modulator waveguides 624 respectively comprise a first doped region 706 having a first doping type (e.g., p-type) and a second doped region 708 having a second doping type (e.g., n-type) opposite the first doping type. In some instances, the first doping type is p-type and the second doping type is n-type, or vice versa. The first doped region 706 abuts the second doped region 708 along a p-n junction. Further, a first doped contact region 702 abuts the first doped region 706 and a second doped contact region 704 abuts the second doped region 708. In various embodiments, the first doped contact region 702 comprises the first doping type (e.g., p-type) and the second doped contact region 704 comprises the second doping type (e.g., n-type).

The first doped contact region 702 is electrically coupled to and is configured to supply a first bias voltage to the first doped region 706. Further, the second doped contact region 704 is electrically coupled to and is configured to supply a second bias voltage to the second doped region 708. For example, the plurality of conductive wires 652 directly overlie the first and second doped contact regions 702, 704 and are configured to supply corresponding bias voltages to the first and second doped regions 706, 708 by way of the first and second doped contact regions 702, 704. By supplying suitable bias conditions to the first and second doped regions 706, 708, refractive indices of the first and second modulator waveguides 622, 624 are adjusted thereby introducing phase shifts along the first and second modulator waveguides 622, 624. In various embodiments, the plurality of electrical I/O structures (116 of FIGS. 6A and 6B) are directly electrically coupled to the first and second doped regions 706, 708 by way of the plurality of conductive wires 652 and the first and second doped contact regions 702, 704. As a result, the plurality of electrical I/O structures (116 of FIGS. 6A and 6B) may supply one or more electrical test signals to the first and second doped regions 706, 708 during, for example, a wafer acceptance test (WAT), a device monitoring process, or the like.

Figure 7B:
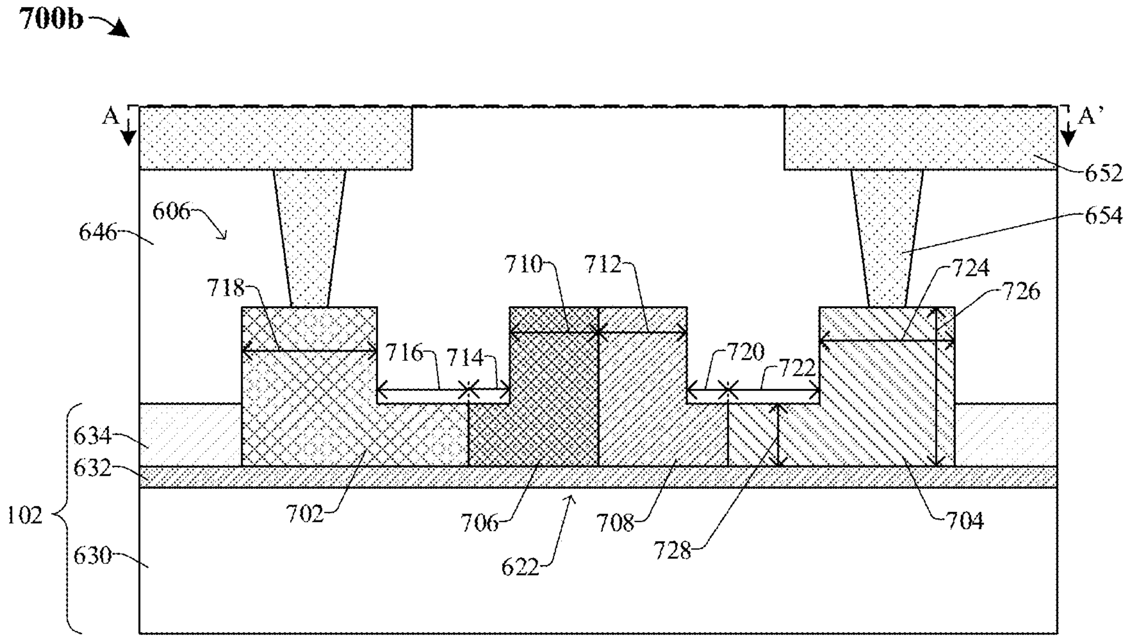

FIG. 7B illustrates a cross-sectional view 700*b* of some embodiments of the third optical device (606 of FIG. 6A) taken along line A-A' of FIG. 7A.

As shown in the cross-sectional view 700*b*, conductive vias 654 overlie the first and second doped contact regions 702, 704. The conductive vias 654 electrically couple the first and second doped contact regions 702, 704 to the conductive wires 652. In various embodiments, the first and second doped contact regions 702, 704 and the first and second doped regions 706, 708 are disposed within the active layer 634 of the semiconductor workpiece 102. The first and second doped contact regions 702, 704 respectively comprise a contact pillar structure with a first height 726 and a lateral contact segment with a second height 728 continuously extending from the contact pillar structure to a corresponding one of the first or second doped regions 706, 708. In some embodiments, the first height 726 is greater than the second height 728. In further embodiments, the first and second doped regions 706, 708 respectively comprise a doped pillar structure with the first height 726 and a lateral doped segment with the second height 728. The first height 726 may, for example, be within a range of about 0.01 to 10 um or some other suitable value. The second height 728 may, for example, be within a range of about 0.01 to 10 um, within a range of about 0.01 to 8 um, or some other suitable value.

The doped pillar structures of the first and second doped regions 706, 708 respectively have widths 710, 712. In some embodiments, the widths 710, 712 may be within a range of about 0.01 to 10 um or some other suitable value. The lateral doped segments of the first and second doped regions 706, 708 respectively have widths 714, 720 that may, for example, be within a range of about 0 to 5 um, about 0.01 to 10 um, or some other suitable value. The contact pillar structures of the first and second doped contact regions 702, 704 respectively have widths 718, 724 that may, for example, be within a range of about 0.01 to 10 um or some other suitable value. Further, lateral contact segments of the first and second doped contact regions 702, 704 respectively have widths 716, 720 that may, for example, be within a range of about 0 to 10 um or some other suitable value.

Figure 8A:
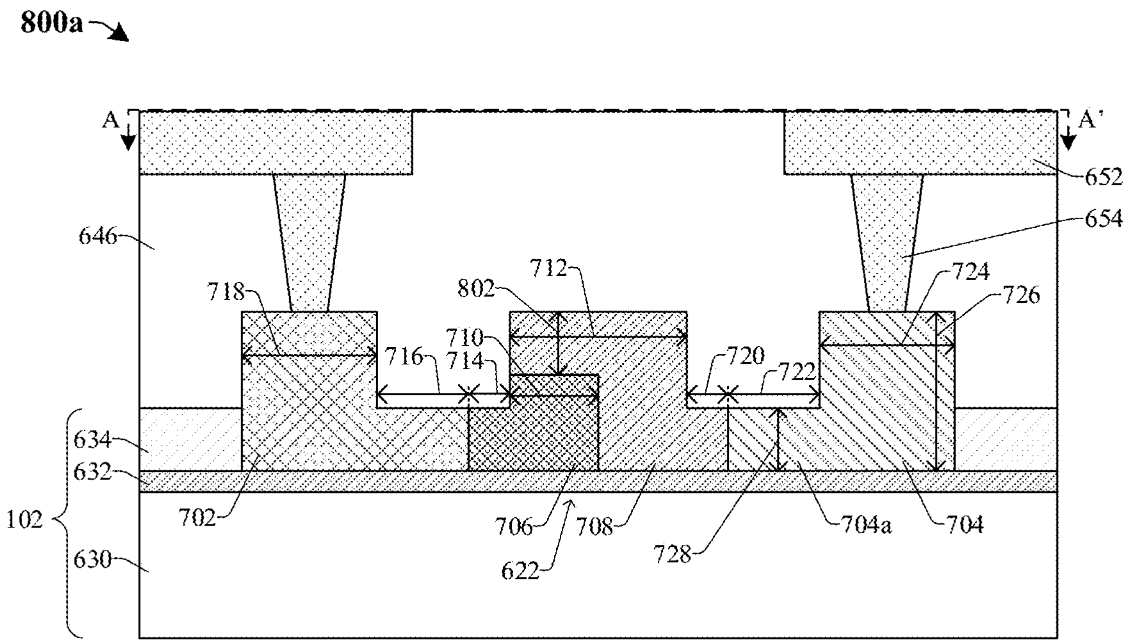
FIGS. 8A and 8B illustrate various cross-sectional views of some other embodiments of the optical device of FIGS. 7A and 7B.

FIG. 8A illustrates a cross-sectional view 800*a* of some other embodiments of the third optical device (606 of FIG. 6A) taken along line A-A' of FIG. 7A, in which a portion of the second doped region 708 directly overlies at least a portion of the first doped region 706. In various embodiments, a third height 802 of the portion of the second doped region 708 directly overlying at least the portion of the first doped region 706 is within a range of about 0.01 to 10 um or some other suitable value.

Figure 8B:
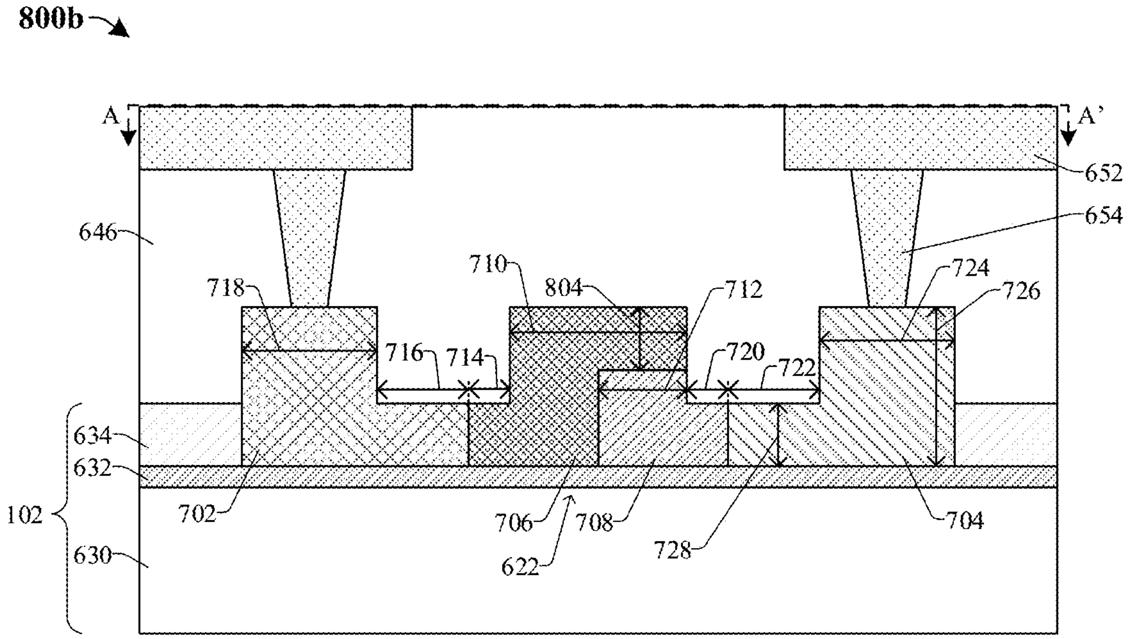

FIG. 8B illustrates a cross-sectional view 800*b* of some other embodiments of the third optical device (606 of FIG. 6A) taken along line A-A' of FIG. 7A, in which a portion of the first doped region 706 directly overlies at least a portion of the second doped region 708. In various embodiments, a fourth height 804 of the portion of the first doped region 706 is within a range of about 0.01 to 10 um or some other suitable value.

Figure 9:
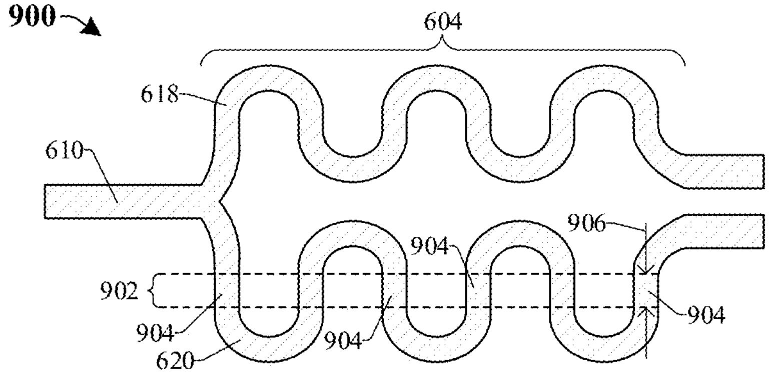
FIG. 9 illustrates a top view of some embodiments of another optical device that may be used in some embodiments of the test line structure.

FIG. 9 illustrates a top view 900 of some embodiments of the second optical device 604 of the integrated chip of FIG. 6A.

As shown in the top view 900, the second optical device 604 comprises the first MZI waveguide 618 and the second MZI waveguide 620. In various embodiments, a light path (e.g., an overall length) of the first MZI waveguide 618 is less than a light path (e.g., an overall length) of the second MZI waveguide 620. In various embodiments, the second MZI waveguide 620 comprises a plurality of waveguide extension segments 904 disposed within a waveguide extension region 902 of the second MZI waveguide 620. Each waveguide extension segment 904 is adjacent to a curved waveguide segment of the second MZI waveguide 620. The plurality of waveguide extension segments 904 increase the light path of the second MZI waveguide 620 to a value greater than that of the first MZI waveguide 618. In various embodiments, lengths of the waveguide extension segments 904 are respectively within a range of about 1 to 100 um or some other suitable value. In further embodiments, the second MZI waveguide 620 comprises between 2 to 128 waveguide extension segments 904. It will be appreciated that other numbers of waveguide extension segments 904 are within the scope of the present disclosure.

Figure 10A:
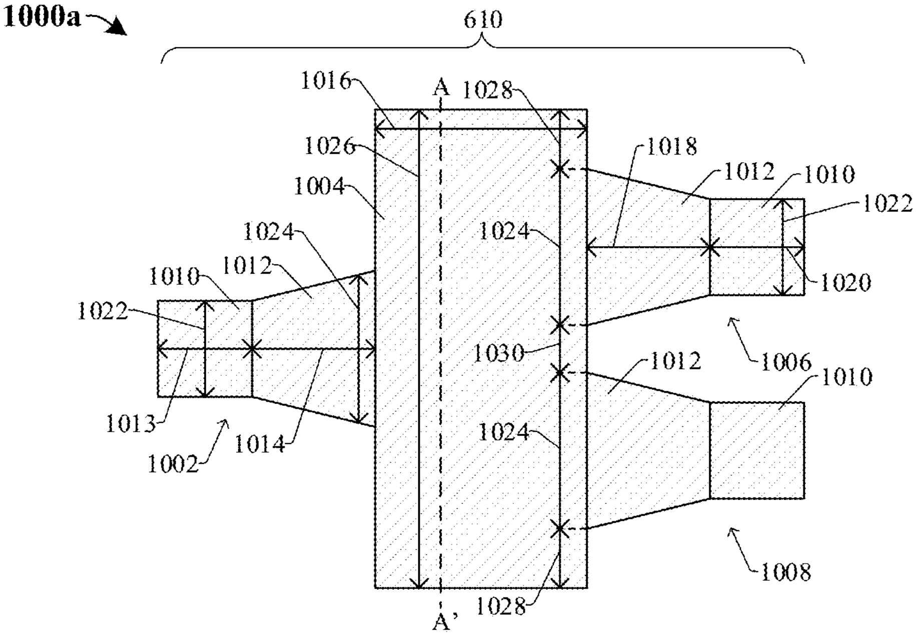
FIGS. 10A and 10B illustrate various views of some embodiments of yet another optical device that maybe used in some embodiments of the test line structure.
Figure 10B:
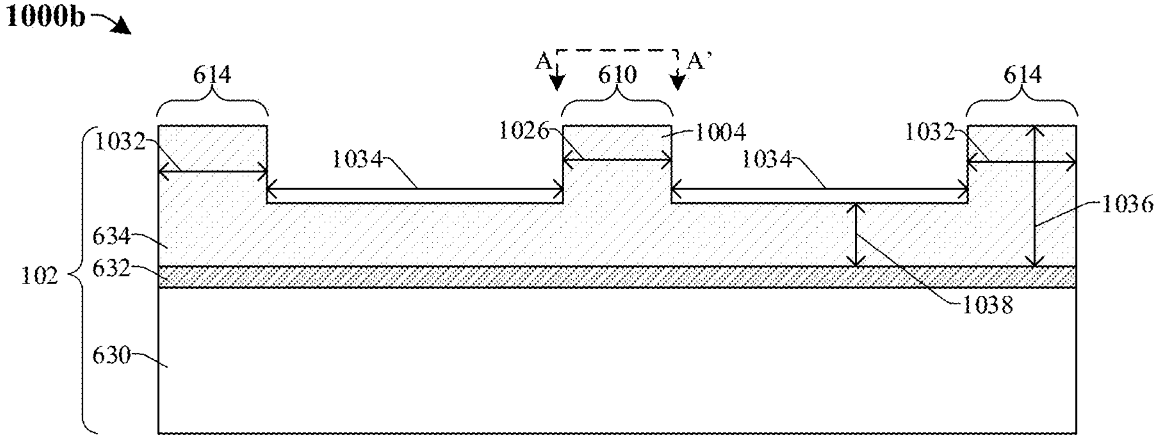

FIGS. 10A-10B illustrate various views of some embodiments of the optical beam splitter 610 of the integrated chip of FIG. 6A. FIG. 10A illustrates a top view 1000*a* of some embodiments of the optical beam splitter 610. FIG. 10B illustrates a cross-sectional view 1000*b* of some embodiments of the optical beam splitter 610 taken along line A-A' of FIG. 10A.

As shown in FIG. 10A, in some embodiments, the optical beam splitter 610 comprises an optical splitter input structure 1002, an optical splitter body 1004, a first optical splitter output structure 1006, and a second optical splitter output structure 1008. In various embodiments, the optical splitter input structure 1002 and the first and second optical splitter output structures 1006, 1008 respectively comprise a splitter tip segment 1010 adjacent to a splitter tapered segment 1012. A width of the splitter tapered segment 1012 continuously increases from the corresponding splitter tip segment 1010 in a direction towards the optical splitter body 1004. The splitter tip segment 1010 may be configured as or optically coupled to a corresponding waveguide. In various embodiments, a length 1013 of the splitter tip segment 1010 of the optical splitter input structure 1002 and a length 1014 of the splitter tapered segment 1012 of the optical splitter input structure 1002 are respectively within a range of about 0.01 to 100 um or some other suitable value. Further, a length 1016 of the optical splitter body 1004 is within a range of about 0.01 to 100 um or some other suitable value. In yet further embodiments, lengths 1018, 1020 of the splitter tapered segment 1012 and the splitter tip segment 1010 of the first and second optical splitter output structures 1006, 1008 are respectively within a range of about 0.01 to 100 um or some other suitable value.

In further embodiments, widths 1022, 1024 of the splitter tip and tapered segments 1010, 1012 of the optical splitter input structure 1002 are respectively within a range of about 0.01 to 10 um or some other suitable value. In yet further embodiments, a width 1026 of the optical splitter body 1004 is within a range of about 0.01 to 10 um or some other suitable value. In various embodiments, widths 1022, 1024 of the splitter tip and tapered segments 1010, 1012 of the first and second optical splitter output structures 1006, 1008 are respectively within a range of about 0.01 to 10 um or some other suitable value. A distance 1030 between the first and second optical splitter output structures 1006, 1008 is within a range of about 0 to 10 um or some other suitable value. Further, spacing 1028 between the first and second optical splitter output structures 1006, 1008 and a corresponding outer sidewall of the optical splitter body 1004 is within a range of about 0 to 10 um or some other suitable value.

As shown in FIG. 10B, the optical beam splitter 610 is laterally spaced from the dummy optical beam splitters 614 by lateral distances 1034. In various embodiments, the lateral distances 1034 are within a range of about 0.01 to 10 um or some other suitable value. In some embodiments, widths 1032 of an optical splitter body of the dummy optical beam splitters 614 may be within a range of about 0.01 to 10 um or some other suitable value. In further embodiments, a height 1038 of a lateral segment of the active layer 634 between the optical beam splitter 610 and the dummy optical beam splitters 614 is within a range of about 0 to 10 um or some other suitable value. In yet further embodiments, a height 1036 of the optical beam splitter 610 and/or the dummy optical beam splitters 614 is within a range of about 0.01 to 10 um or some other suitable value.

Figure 11:
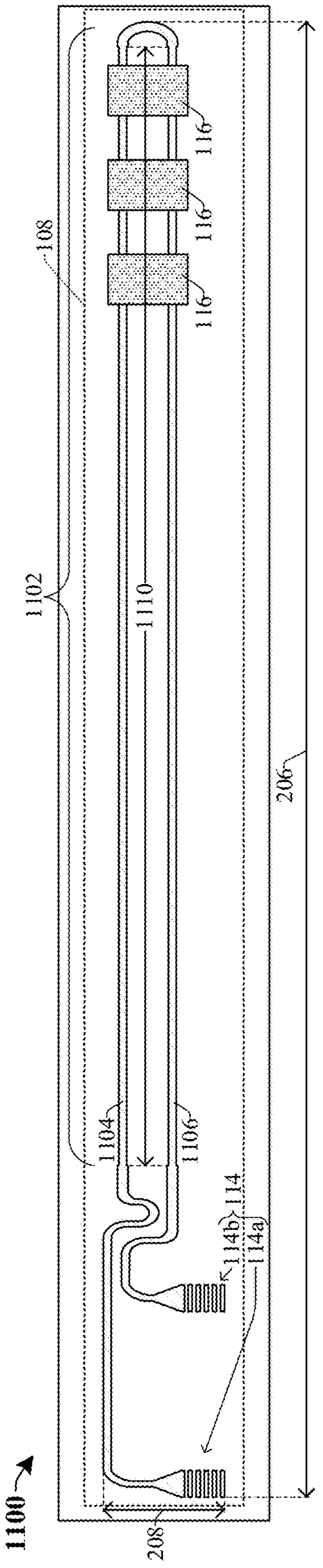
FIG. 11 illustrates a top view of some other embodiments of an integrated chip comprising a test line structure having a plurality of optical I/O structures, a plurality of electrical I/O structures, and one or more optical devices.

FIG. 11 illustrates a top view 1100 of some embodiments of an integrated chip having a test line structure 108 comprising a plurality of optical I/O structures 114, a plurality of electrical I/O structures 116, and an optical device 1102.

In various embodiments, the plurality of optical I/O structures 114 comprises a first optical I/O structure 114*a* and a second optical I/O structure 114*b*. The optical device 1102 may, for example, be configured as an optical modulator or some other suitable optical device. In various embodiments, the optical device 1102 may be configured as illustrated and/or described in FIGS. 7A-7B. The optical device 1102 comprises a first waveguide 1104 optically coupled to the first optical I/O structure 114*a* and a second waveguide 1106 optically coupled to the second I/O structure 114*b*. In some embodiments, the optical device 1102 comprises one or more doped regions (e.g., disposed along the first and/or second waveguides 1104, 1106) (not shown) configured to adjust characteristics (e.g., adjust refractive indices) of the first and second waveguides 1104, 1106. Bias voltages may be applied to the one or more doped regions by way of the plurality electrical I/O structures 116 to introduce a phase shift along the first and/or second waveguides 1104, 1106. In yet further embodiments, the plurality of electrical I/O structures 116 directly overlie at least a portion of the optical device 1102. In various embodiments, bias voltages applied to the one or more doped regions by way of the electrical I/O structures 116 may be within a range of about 0 to 10 volts or some other suitable value.

In some embodiments, an input optical signal may be received at the first optical I/O structure 114*a* and provided to the first waveguide 1104 of the optical device 1102. The optical device 1102 may apply one or more phase shifts to the input optical signal along the first and/or second waveguides 1104, 1106 by virtue of bias voltages applied by the electrical I/O structures 116. The optical device 1102 generates an output optical signal based on the one or more phase shifts and the input optical signal. The output optical signal is provided to the second optical I/O structure 114*b*. In various embodiments, a wafer prober and/or controller circuit may perform a comparison on the input optical signal and the output optical signal to determine an insertion loss of the optical device 1102. In various embodiments, a test line length 206 of the test line structure 108 is within a range of about 1 to 32 mm or some other suitable value. In further embodiments, a test line width 208 of the test line structure 108 is within a range of about 40 to 240 um or some other suitable value. In yet further embodiments, a length 1110 of the first and second waveguides 1104, 1106 is within a range of about 10 um to 1 mm or some other suitable value.

Figure 12:
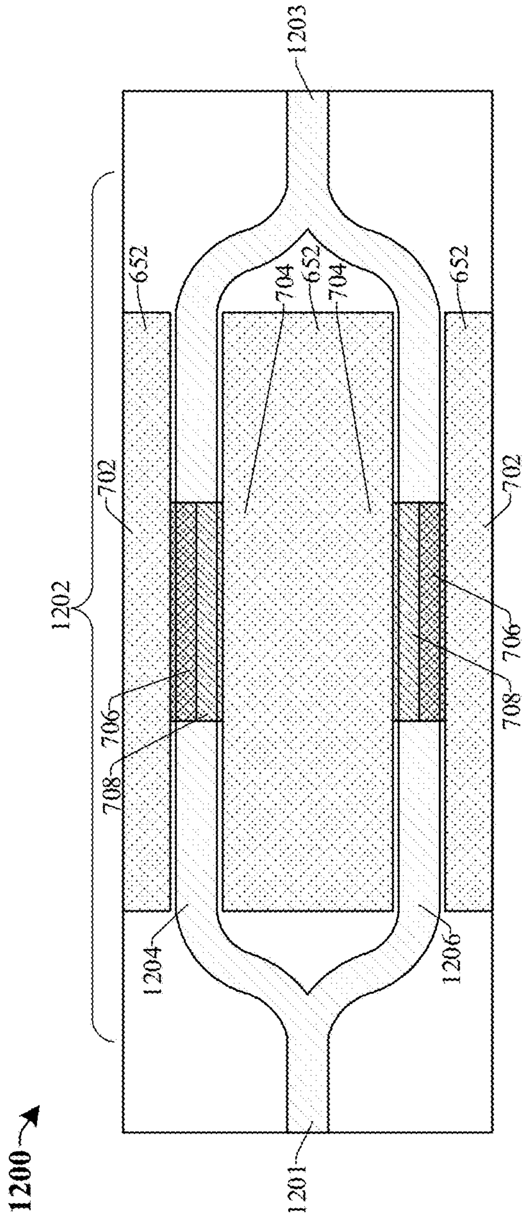
FIG. 12 illustrates a top view of some embodiments of another optical device that may be used in some embodiments of the test line structure.

FIG. 12 illustrates a top view 1200 of some embodiments of an optical device 1202 that may be used in some embodiments of a test line structure. For example, the optical device 1102 of FIG. 11 may be configured as the optical device 1202 of FIG. 12.

As illustrated in FIG. 12, the optical device 1202 comprises an input waveguide 1201 that splits into a first waveguide 1204 and a second waveguide 1206 by, for example, an optical beam splitter at a first end of the optical device 1202. Further, the first and second waveguides 1204 and 1206 combine into an output waveguide 1203 by, for example, an optical beam combiner disposed at a second end of the optical device 1202. The optical device 1202 may be configured as an MZM, an optical modulator, or the like. The first and second waveguides 1204, 1206 respectively comprise a first doped region 706 having a first doping type (e.g., p-type) and a second doped region 708 having a second doping type (e.g., n-type) opposite the first doping type. A first doped contact region 702 abuts the first doped region 706 and a second doped contact region 704 abuts the second doped region 708. The first doped contact region 702 comprises the first doping type (e.g., p-type) and the second doped contact region 704 comprises the second doping type (e.g., n-type).

The first doped contact region 702 is electrically coupled to and is configured to supply a first bias voltage to the first doped region 706. Further, the second doped contact region 704 is electrically coupled to and is configured to supply a second bias voltage to the second doped region 708. By supplying suitable bias conditions to the first and second doped regions 706, 708, refractive indices of the first and/or second waveguides 1204, 1206 may be adjusted thereby introducing one or more phase shifts along the first and/or second waveguides 1204, 1206. In various embodiments, the plurality of electrical I/O structures (116 of FIG. 11) are electrically coupled to the first and second doped regions 706, 708 by way of the first and second doped contact regions 702, 704. In further embodiments, the first optical I/O structure (114*a* of FIG. 11) is optically coupled to the input waveguide 1201 and is configured to supply an input optical test signal to the input waveguide 1201. In such embodiments, the second optical I/O structure (114*b* of FIG. 11) is optically coupled to the output waveguide 1203 and is configured to receive an output optical test signal from the optical device 1202.

Figure 13A:
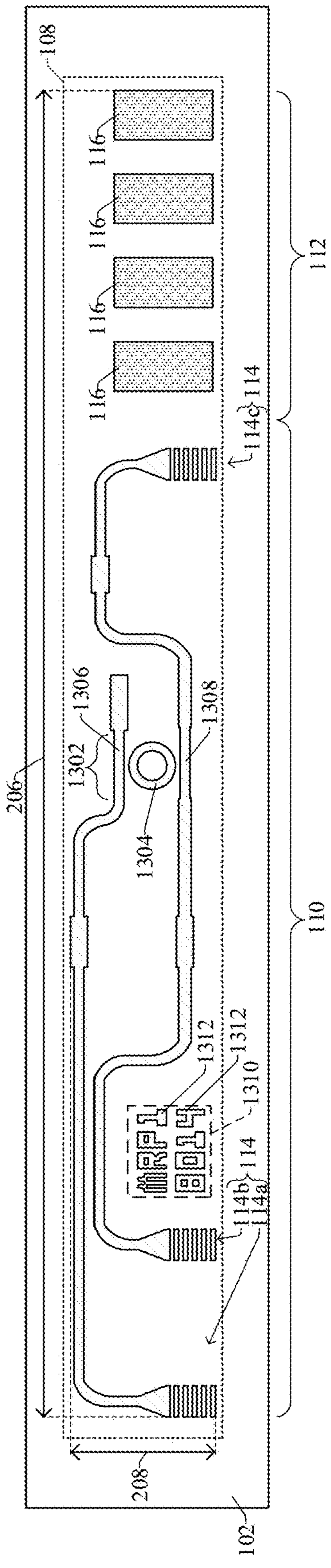
FIGS. 13A-13C illustrate various views of some additional embodiments of an integrated chip comprising a test line structure having a plurality of optical I/O structures, a plurality of electrical I/O structures, and one or more optical devices.

FIG. 13A illustrates a top view 1300*a* of some other embodiments of an integrated chip having a test line structure 108 comprising a plurality of optical I/O structures 114, a plurality of electrical I/O structures 116, and an optical device 1302.

In some embodiments, the plurality of optical I/O structures 114 comprises a first optical I/O structure 114*a*, a second optical I/O structure 114*b*, and a third optical I/O structure 114*c*. The optical device 1302 may, for example, be configured as an optical modulator, a micro-ring modulator (MRM), or some other suitable optical device. In various embodiments, the optical device 1302 comprises a first I/O waveguide 1306 optically coupled to the first optical I/O structure 114*a*, a second I/O waveguide 1308 optically coupled to the second and third optical I/O structures 114*b*, 114*c*, and a ring-shaped waveguide 1304 disposed laterally between segments of the first and second I/O waveguides 1306, 1308. The first and second I/O waveguides 1306, 1308 are sufficiently close to the ring-shaped waveguide 1304 such that the first and/or second I/O waveguides 1306, 1308 is/are optically coupled to the ring-shaped waveguide 1304. In some embodiments, an input optical test signal is provided to the second I/O structure 114*b* and is transmitted across the second I/O waveguide 1308 to the ring-shaped waveguide 1304. The ring-shaped waveguide 1304 is configured to receive the input optical test signal, apply a phase shift to the input optical test signal, and generate a corresponding output optical test signal based on the phase shift and the input optical test signal. In various embodiments, the ring-shaped waveguide 1304 is configured to apply the phase shift based on bias voltages applied to one or more doped regions (not shown) (e.g., see FIGS. 13B and 13C) disposed along the ring-shaped waveguide 1304. The bias voltages are applied to the one or more doped regions of the ring-shaped waveguide 1304 by way of the plurality of electrical I/O structures 116. The output optical test signal may be provided to the third optical I/O structure 114*c* by way of the second I/O waveguide 1308. In yet further embodiments, the first I/O waveguide 1306 is configured to receive or transmit an optical signal to or from the ring-shaped waveguide 1304. In various embodiments, bias voltages applied to the one or more doped regions by way of the electrical I/O structures 116 may be within a range of about 0 to 10 volts or some other suitable value.

In some embodiments, the test line structure 108 further comprises a test line letter structure 1310 that comprises one or more test line letters 1312 configured to optically identify the test line structure 108. For example, the one or more test line letters 1312 may be used to identify that the optical device 1302 of the test line structure 108 is configured as a micro-ring modulator (MRM) or some other suitable device. In various embodiments, the one or more test line letters 1312 are configured as alpha numeric characters disposed within and/or on the semiconductor workpiece 102. For example, the one or more test line letters 1312 may be or comprise one or more trenches extending into the semiconductor workpiece 102 and/or may be or comprise one or more protrusions extending from an upper surface of the semiconductor workpiece 102. Further, the test line structure 108 may be part of an array of test line structures disposed across the semiconductor workpiece 102. In various embodiments, each test line structure in the array may comprise a corresponding test line letter structure configured to optically identify each test line structure in the array. For instance, each test line structure in the array may be configured to comprise different optical devices and/or may be configured to perform different tests. In such an embodiment, one or more first test line structures in the array may be configured to perform a wafer acceptance test (WAT), while different one or more second test line structures may be used as monitoring structures configured to monitor performance of semiconductor devices (e.g., optical devices) disposed within device regions across the semiconductor workpiece 102. In yet further embodiments, the test line structure 108 is directly adjacent to a corresponding optical I/O structure in the plurality of optical I/O structures 114.

Figure 13B:
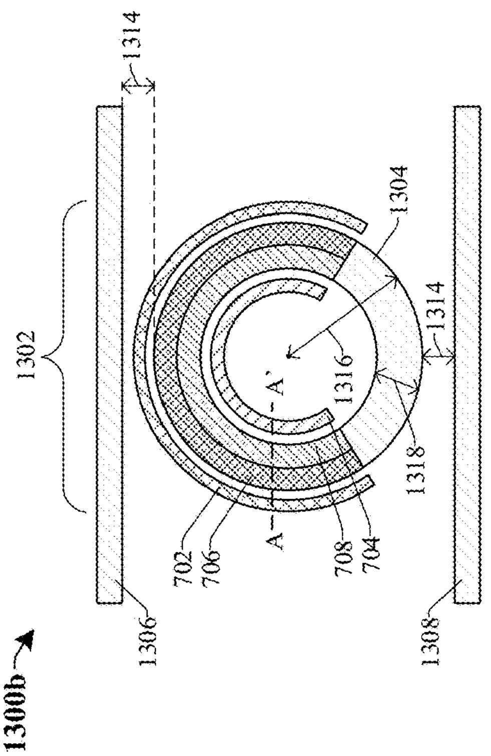
Figure 13C:
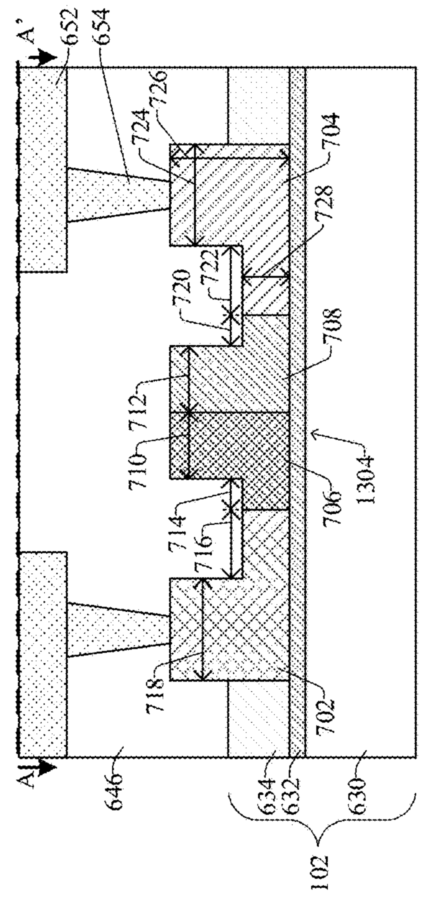

FIGS. 13B and 13C illustrate various views of some embodiments of the optical device 1302 of the integrated chip of FIG. 13A. FIG. 13B illustrates a top view 1300*b* of some embodiments of the optical device 1302 of FIG. 13A. FIG. 13C illustrates a cross-sectional view 1300*c* of some embodiments of the optical device 1302 taken along line A-A' of FIG. 13B.

As shown in the top view 1300*b* of FIG. 13B, the ring-shaped waveguide 1304 comprises a first doped region 706 having a first doping type (e.g., p-type) and a second doped region 708 having a second doping type (e.g., n-type) opposite the first doping type. The first doped region 706 abuts the second doped region 708 along a p-n junction. Further, a first doped contact region 702 abuts the first doped region 706 and a second doped contact region 704 abuts the second doped region 708. In various embodiments, the first doped contact region 702 comprises the first doping type (e.g., p-type) and the second doped contact region 704 comprises the second doping type (e.g., n-type).

The first doped contact region 702 is electrically coupled to and is configured to supply a first bias voltage to the first doped region 706. Further, the second doped contact region 704 is electrically coupled to and is configured to supply a second bias voltage to the second doped region 708. By supplying suitable bias conditions to the first and second doped regions 706, 708, a refractive index of the ring-shaped waveguide 1304 is adjusted thereby introducing one or more phase shifts along the ring-shaped waveguide 1304. In various embodiments, the plurality of electrical I/O structures (116 of FIG. 13A) are electrically coupled to the first and second doped regions 706, 708 by way of the first and second doped contact regions 702, 704. As a result, the plurality of electrical I/O structures (116 of FIG. 13A) may supply one or more electrical test signals to the first and second doped regions 706, 708 during, for example, a wafer acceptance test (WAT), a device monitoring process, or the like.

In various embodiments, an outer radius 1316 of the ring-shaped waveguide 1304 is within a range of about 0.1 to 30 um or some other suitable value. In further embodiments, a size 1318 of the ring-shaped waveguide 1304 is within a range of about 0.01 to 10 um or some other suitable value. In some embodiments, widths of the first and/or second I/O waveguides 1306, 1308 are respectively within a range of about 0.01 to 10 um or some other suitable value. In yet further embodiments, spacing 1314 between the ring-shaped waveguide 1304 and the first and/or second I/O waveguides 1306, 1308 is within a range of about 0.01 to 10 um or some other suitable value.

As shown in the cross-sectional view 1300*c* of FIG. 13C, one or more conductive vias 654 overlie and are electrically coupled to the first and second doped contact regions 702, 704. The first and second doped regions 706, 708 of the ring-shaped waveguide 1304 abut one another and are disposed laterally between the first and second doped contact regions 702, 704. In various embodiments, the first and second doped contact regions 702, 704 and the first and second doped regions 706, 708 may have heights and widths as illustrated and/or described in FIG. 7B.

Figure 14A:
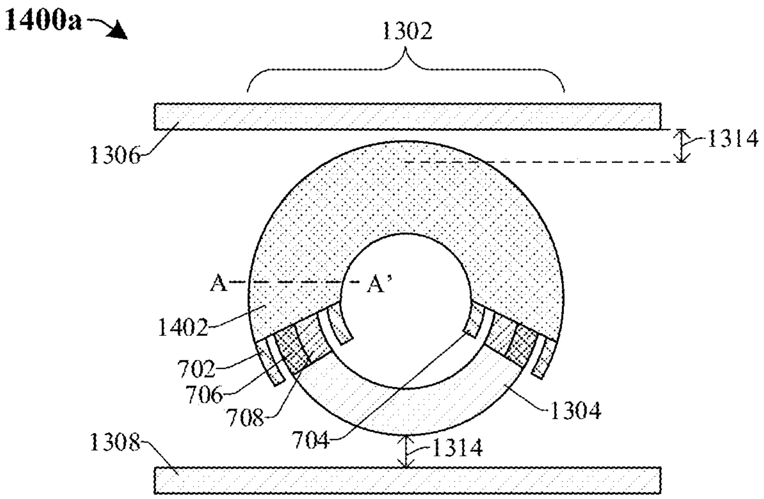
FIGS. 14A and 14B illustrate various views of some other embodiments of an optical device that may be used in some embodiments of the test line structure.
Figure 14B:
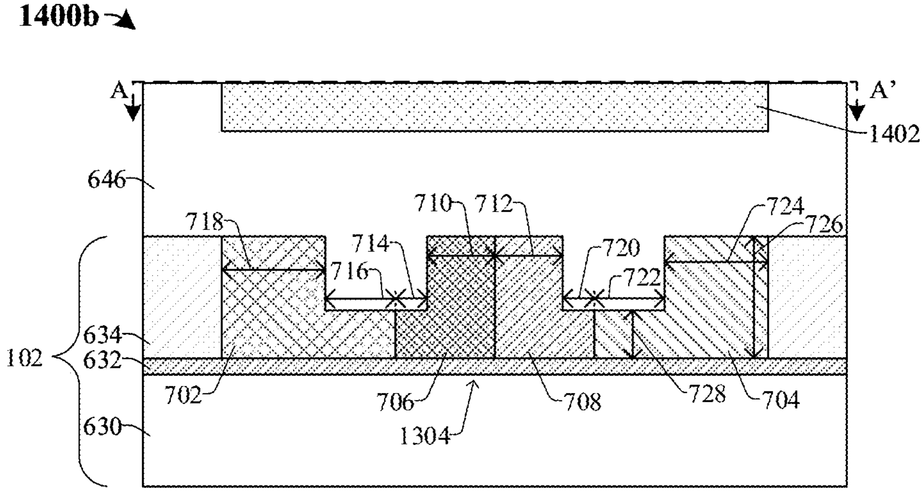

FIGS. 14A and 14B illustrate various views of some other embodiments of the optical device 1302 of FIG. 13A. FIG. 14A illustrates a top view 1400*a* of some embodiments of the optical device 1302 of FIG. 14A. FIG. 14B illustrates a cross-sectional view 1400*b* of some embodiments of the optical device 1302 taken along line A-A' of FIG. 14A.

As shown in FIG. 14A, a heater structure 1402 directly overlies the ring-shaped waveguide 1304. The heater structure 1402 is configured to generate heat that travels towards the ring-shaped waveguide 1304 and changes (e.g., increases) a temperature of the ring-shaped waveguide 1304. The change in temperature of the ring-shaped waveguide 1304 adjusts characteristics of the ring-shaped waveguide 1304 (e.g., adjusts a refractive index of the ring-shaped waveguide 1304) and introduces one or more phase shifts to an optical signal passing along and/or within the ring-shaped waveguide 1304. In various embodiments, the heater structure 1402 is configured to generate heat based on one or more bias voltages applied to the heater structure 1402 by way of the electrical I/O structures (116 of FIG. 13A).

As shown in FIG. 14B, the heater structure 1402 is disposed within the interconnect dielectric structure 646 and is vertically spaced from the ring-shaped waveguide 1304. In various embodiments, a distance between the heater structure 1402 and the ring-shaped waveguide 1304 is within a range of about 0.01 to 10 um or some other suitable value.

Figure 15A:
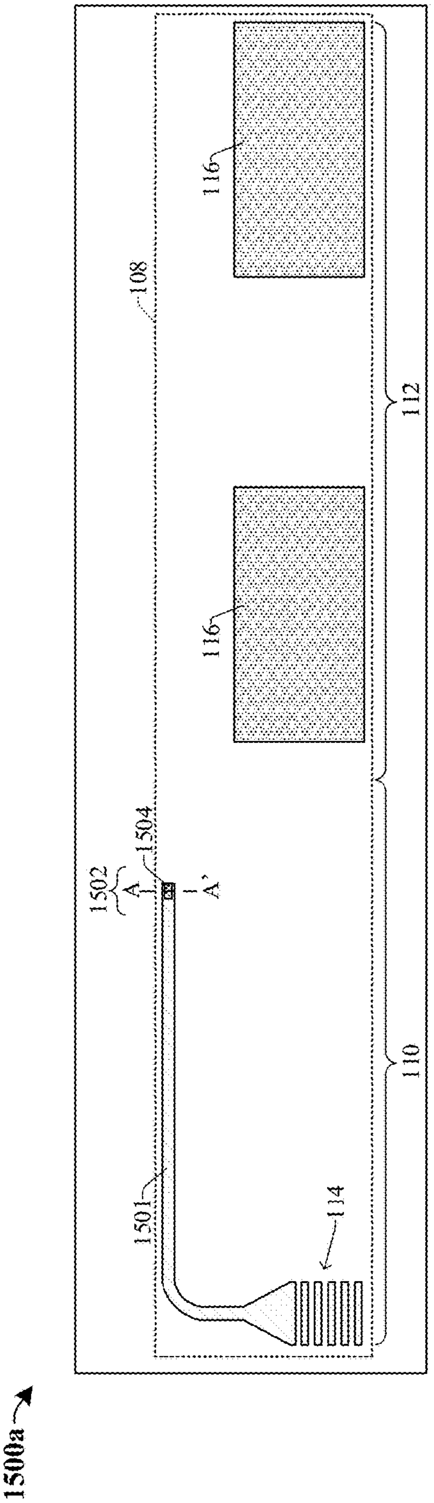
FIGS. 15A and 15B illustrate various views of further embodiments of an integrated chip comprising a test line structure having one or more optical I/O structures, a plurality of electrical I/O structures, and one or more optical devices.
Figure 15B:
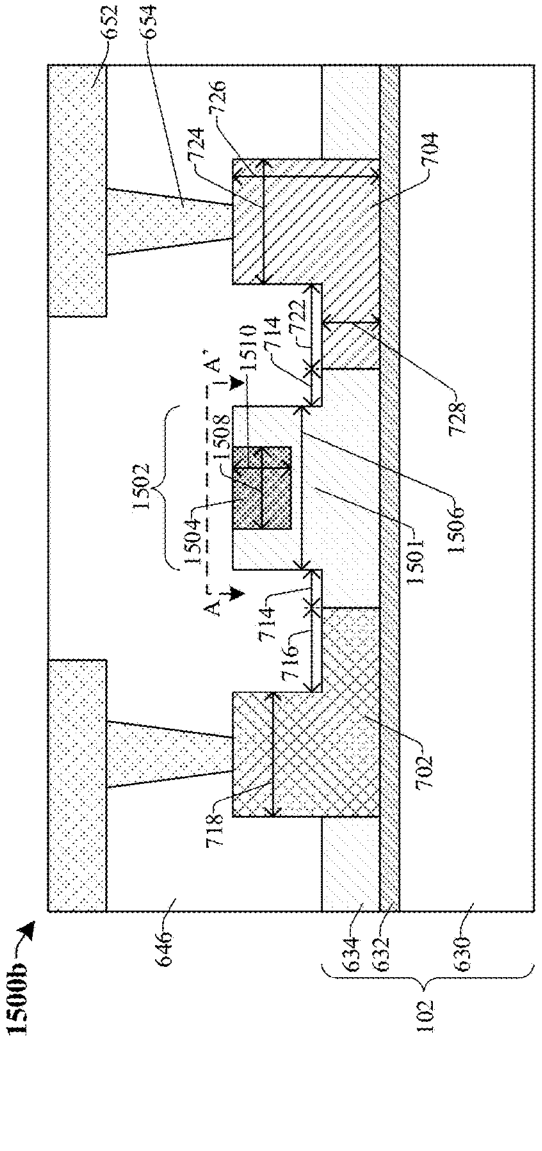

FIGS. 15A and 15B illustrate various views of some other embodiments of an integrated chip having a test line structure 108 comprising an optical I/O structure 114, a plurality of electrical I/O structures 116, and an optical device 1502. FIG. 15A illustrates a top view 1500*a* of some embodiments of the integrated chip. FIG. 15B illustrates a cross-sectional view 1500*b* of some embodiments of the integrated chip taken along line A-A' of FIG. 15A.

As shown in FIG. 15A, in various embodiments the optical device 1502 is configured as a photodetector (e.g., a photodiode) or some other suitable device. In some embodiments, the optical device 1502 comprises a photodetector layer 1504 disposed within a waveguide 1501. The optical I/O structure 114 is optically coupled to the waveguide 1501 and is configured to receive an input optical signal. The input optical signal is provided to the optical device 1502 by way of the waveguide 1501 and the optical I/O structure 114. In some embodiments, the electrical I/O structures 116 are configured to receive output electrical signals from the optical device 1502 based on a response of the optical device 1502 to the input optical signal. In some embodiments, the waveguide 1501 comprises a first semiconductor material (e.g., silicon) and the photodetector layer 1504 comprises a second semiconductor material (e.g., germanium) different from the first semiconductor material.

As shown in FIG. 15B, in various embodiments, first and second doped contact regions 702, 704 are disposed within the active layer 634 on opposing sides of the optical device 1502. The first doped contact region 702 comprises a first doping type (e.g., p-type) and the second doped contact region 704 comprises a second doping type (e.g., n-type) opposite the first doping type. In various embodiments, the first and second doped contact regions 702, 704 are electrically coupled to the electrical I/O structures (116 of FIG. 15A) by way of the conductive vias 654 and the conductive wires 652. In some embodiments, output electrical signals from the optical device 1502 may be provided to the electrical I/O structures (116 of FIG. 15A) by way of the first and second doped contact regions 702, 704. In some embodiments, a width of the waveguide 1501 is within a range of about 0.01 to 10 um or some other suitable value. In various embodiments, a width 1508 of the photodetector layer 1504 may be within a range of about 0.01 to 10 um or some other suitable value. In further embodiments, a height 1510 of the photodetector layer 1504 may be within a range of 0.01 to 10 um or some other suitable value.

Figure 16A:
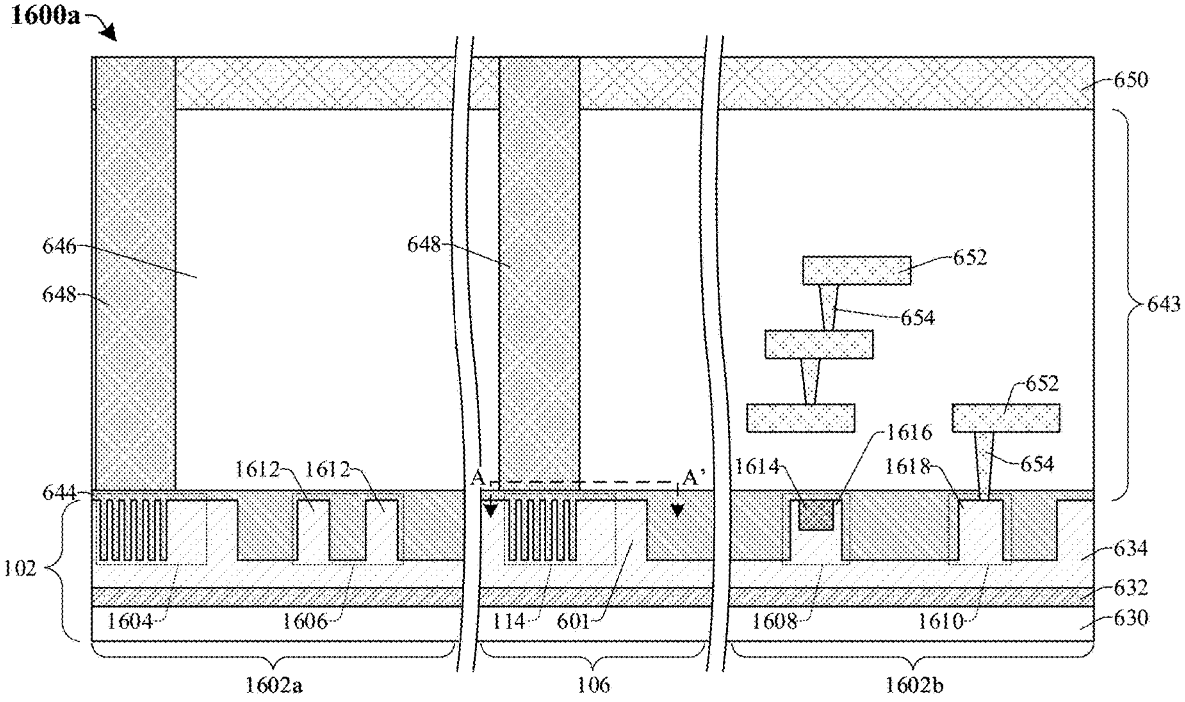
FIGS. 16A-16C illustrate various views of some embodiments of an integrated chip comprising a test line structure disposed laterally between a first device region and a second device region, where the first and second device regions respectively comprise one or more optical devices.
Figure 16B:
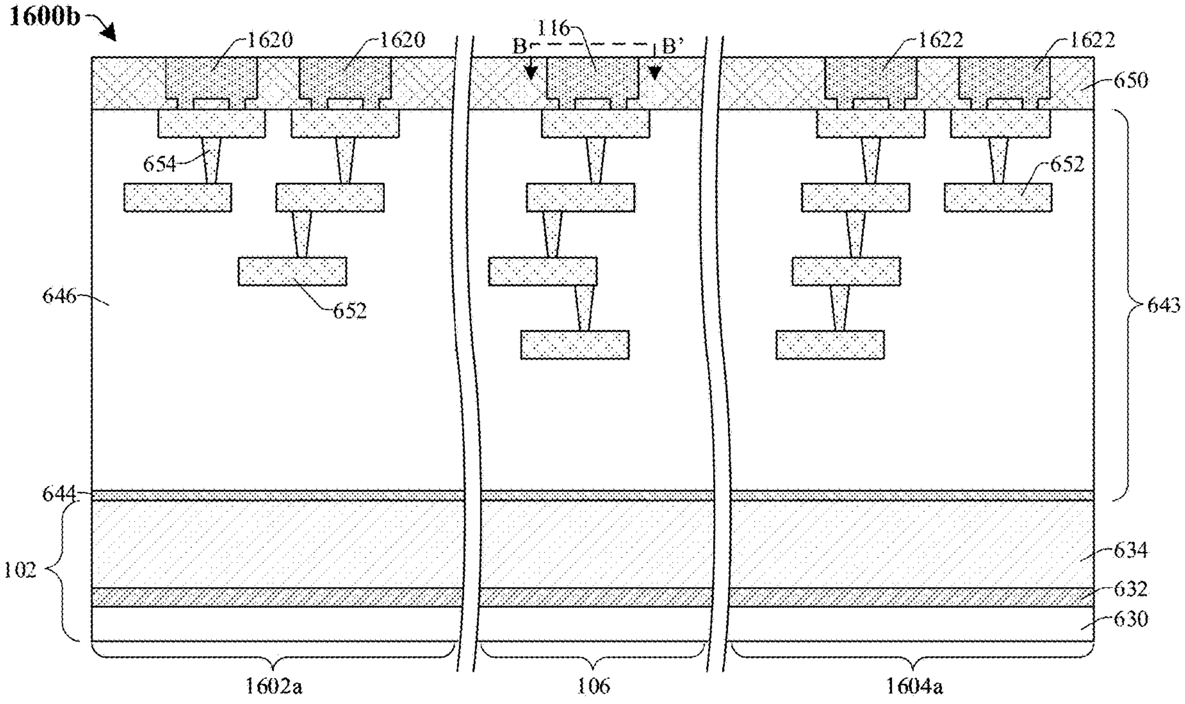
Figure 16C:
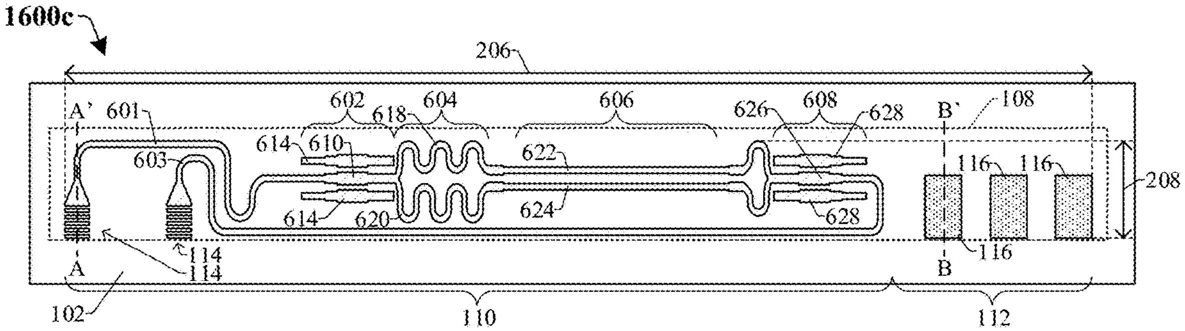

FIGS. 16A-16C illustrate various views of some embodiments of an integrated chip comprising a test line structure 108 disposed between a first device region 1602*a* and a second device region 1602*b*. FIG. 16C illustrates a top view 1600*c* of some embodiments of the integrated chip. FIG. 16A illustrates a cross-sectional view 1600*a* of some embodiments of the integrated chip, where a portion of the cross-sectional view 1600*a* of FIG. 16A is taken along line A-A' of the top view 1600*c* of FIG. 16C. FIG. 16B illustrates a cross-sectional view 1600*b* of some embodiments of the integrated chip, where a portion of the cross-sectional view 1600*b* of FIG. 16B is taken along line B-B' of the top view 1600*c* of FIG. 16C.

The first device region 1602*a* comprises a first plurality of optical devices 1604, 1606 and the second device region 1602*b* comprises a second plurality of optical devices 1608, 1610. In various embodiments, the first plurality of optical devices 1604, 1606 and the second plurality of optical devices 1608, 1610 respectively are configured as or comprise photodetector(s), optical modulator(s), optical interferometer(s), waveguide(s), grating coupler(s), some other suitable optical device, or any combination of the foregoing. The test line structure 108 comprises a plurality of optical I/O structures 114, a plurality of electrical I/O structures 116, and a plurality of optical devices 602-608. In various embodiments, the test line structure 108 may be configured as illustrated and/or described in FIGS. 6A and 6B. It will be appreciated that while the test line structure 108 is configured as illustrated and/or described in FIGS. 6A-B, the test line structure 108 may be configured as illustrated and/or described in FIG. 11-12, 13A-C, or 15A-B.

As shown in FIG. 16A, the interconnect structure 643 overlies the semiconductor workpiece 102. In some embodiments, the first device region 1602*a* is part of a first semiconductor die and the second device region 1602*b* is part of a second semiconductor die. The first plurality of optical devices 1604, 1606 are disposed within and/or on the semiconductor workpiece 102 and comprises a first optical device 1604 and a second optical device 1606. In some embodiments, the first optical device 1604 is configured as grating coupler and may receive and/or transmit optical signals from or to other optical devices disposed in the first device region 1602*a*. In further embodiments, the second optical device 1606 comprises two or more optical waveguides 1612 that may be part of or configured as an optical modulator or some other suitable optical device. In various embodiments, the first optical device 1604 may be configured to receive an input optical signal and provide the input optical signal to at least one of the optical waveguides 1612.

The test line structure (108 of FIG. 16C) is disposed within a test line region 106. In some embodiments, the test line region 106 is spaced directly between the first device region 1602*a* and the second device region 1602*b*. At least one of the optical I/O structures 114 is disposed within the test line region 106 and is optically coupled to the first waveguide 601. A plurality of optical I/O channels 648 extend through the passivation structure 650 and the interconnect structure 643. The optical I/O channels 648 overlie the first optical device 1604 and the optical I/O structures 114. In various embodiments, the optical I/O channels 648 may be configured as a fiber optic waveguide, a light pipe structure, or the like, and the optical I/O channels 648 are configured to provide an input optical signal and/or receive an output optical signal.

The second plurality of optical devices 1608, 1610 are disposed within and/or on the semiconductor workpiece 102 and comprises a third optical device 1608 and a fourth optical device 1610. In various embodiments, the third optical device 1608 is configured as a photodetector (e.g., a photodiode) or some other optical device and/or the fourth optical device 1610 is configured as a waveguide, an optical core structure, or some other optical device. In further embodiments, the third optical device 1608 comprises a photodetector waveguide 1616 and a photodetector layer 1614 disposed within the photodetector waveguide 1616. In yet further embodiments, the fourth optical device 1610 comprises a waveguide 1618. Conductive wires and vias 652, 654 overlie and may be electrically coupled to the third and/or fourth optical devices 1608, 1610.

As shown in FIG. 16B, electrical I/O structures 116 are disposed within the test line region 106. Further, a first plurality of bond pads 1620 are disposed within the first device region 1602*a* and a second plurality of bond pads 1622 are disposed within the second device region 1602*b*. In some embodiments, the electrical I/O structures 116, the first plurality of bond pads 1620, and the second plurality of bond pads 1622 respectively comprise a conductive material (e.g., titanium, platinum, gold, some other conductive material, or any combination of the foregoing). The electrical I/O structures 116, the first plurality of bond pads 1620, and the second plurality of bond pads 1622 are electrically coupled to corresponding devices (e.g., optical devices) disposed on the semiconductor workpiece 102 by way of the plurality of conductive wires and vias 652, 654. For example, the second plurality of bond pads 1622 may be directly electrically coupled to the third and fourth optical devices 1608, 1610 by way of the conductive wires and vias 652, 654.

FIG. 17 illustrates a top view 1700 of some embodiments of an integrated chip having a plurality of semiconductor dies 104 laterally adjacent to one another.

In some embodiments, each semiconductor die 104 comprises a device region 1602 comprising a plurality of semiconductor devices (e.g., optical devices) disposed within and/or on a semiconductor workpiece 102. In some embodiments, during fabrication the semiconductor dies 104 are separated from one another by "dicing" the semiconductor workpiece 102 along orthogonal scribe lines (or saw "streets") 1702, 1704 using a singulation process. In various embodiments, the singulation process includes using a saw blade and/or a cutting laser to cut through the scribe lines 1702, 1704. In further embodiments, one or more test line structures 108 is disposed along each of the scribe lines 1702, 1704. For instance, a test line structure 108 may be disposed within a first scribe line 1702*a* between a first semiconductor die 104*a* and a second semiconductor die 104*b*, where the first and second semiconductor dies 104*a*, 104*b* respectively comprise a first device region 1602*a* and a second device region 1602*b*. The one or more test line structures 108 each comprise one or more optical I/O structures 114 and one or more electrical I/O structures 116 respectively configured to receive one or more optical test signals and one or more electrical test signals. In various embodiments, the one or more test line structures 108 are configured to perform a wafer acceptance test, a device monitoring process, or the like during fabrication of the semiconductor dies before performing the singulation process. In yet further embodiments, the one or more test line structures 108 comprise one or more optical devices (e.g., as illustrated and/or described in FIG. 6A, 11, 13A, or 15A).

FIGS. 18-23B illustrate various views 1800-2300*b* of some embodiments of a method for forming an integrated chip having a test line structure comprising electrical and optical I/O structures according to the present disclosure. Although the various views 1800-2300*b* shown in FIGS. 18-23B are described with reference to a method, it will be appreciated that the structures shown in FIGS. 18-23B are not limited to the method but rather may stand alone separate of the method. Furthermore, although FIGS. 18-23B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 18:
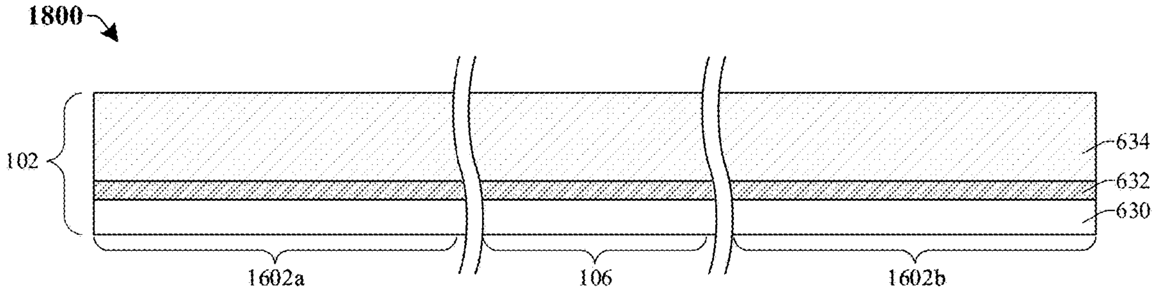
FIGS. 18-23B illustrate various views of some embodiments of a method for forming an integrated chip including a test line structure comprising a plurality of optical I/O structures and a plurality of electrical I/O structures.

As shown in cross-sectional view 1800 of FIG. 18, a semiconductor workpiece 102 is provided. In various embodiments, the semiconductor workpiece 102 may be or comprise a semiconductor body (e.g., silicon, silicon germanium, etc.), such as a semiconductor wafer and/or one or more semiconductor die on a wafer, any other type od semiconductor and/or epitaxial layer(s), or the like. In some embodiments, the semiconductor workpiece 102 comprises a SOI substrate having a base substrate 630 separated from an active layer 634 by an insulator structure 632. Further, the semiconductor workpiece 102 comprises a first device region 1602*a* separated from a test line region 106 by a second device region 1602*b*.

Figure 19A:
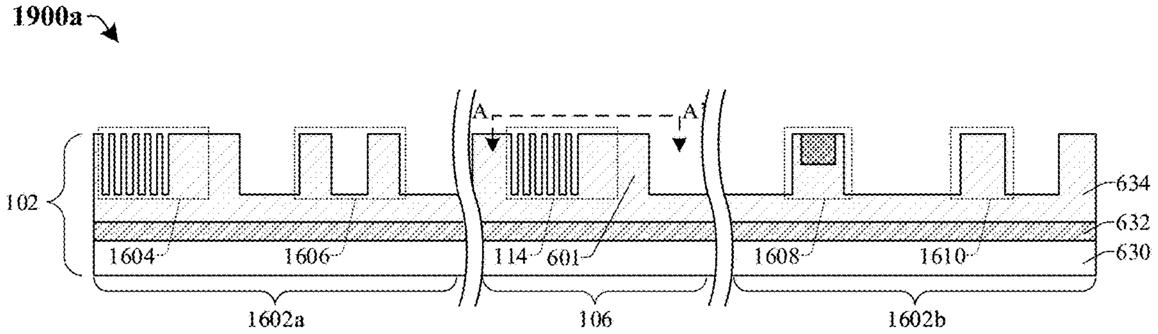
Figure 19B:
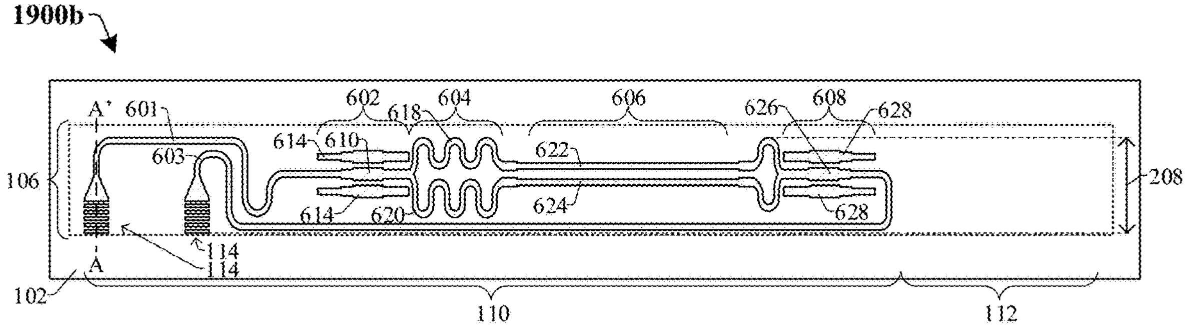

As shown in cross-sectional view 1900*a* of FIG. 19A and top view 1900*b* of FIG. 19B, a first plurality of optical devices 1604, 1606 are formed in the first device region 1602*a*, a plurality of optical I/O structures 114 are formed in the test line region 106, and a second plurality of optical devices 1608, 1610 are formed in the second device region 1602*b*. In various embodiments, a plurality of optical devices 602-608 are formed within the test line region 106 next to the plurality of optical I/O structures 114. In some embodiments, a process for forming the optical devices 1604-1610, 602-608 includes performing one or more patterning process(es) on the active layer 634, performing one or more deposition process(es), performing one or more selective ion implantation process(es), or the like. In various embodiments, a process for forming the plurality of optical I/O structures 114 includes: forming a masking layer (not shown) over the active layer 634; performing an etching process (e.g., a wet etch process, a dry etch process, or any combination of the foregoing) on the active layer 634 with the masking layer in place; and performing a removal process to remove the patterned masking layer. In yet further embodiments, the plurality of optical I/O structures 114 and/or the plurality of optical device 602-608 may be formed concurrently with one another and/or may be formed concurrently with one or more of the optical devices in the first and second plurality of optical devices 1604-1610 in the first and second device regions 1602*a*-*b*.

FIG. 19B illustrates the top view 1900*b* corresponding to the test line region 106 of the cross-sectional view 1900*a* of FIG. 19A. A portion of the cross-sectional view 1900*a* of FIG. 19A is taken along line A-A' of the top view 1900*b* of FIG. 19B.

Figure 20:
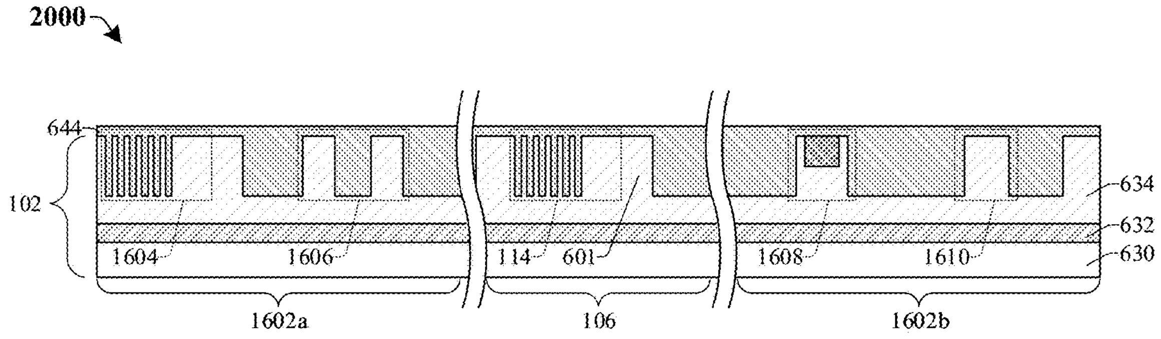

As shown in cross-sectional view 2000 of FIG. 20, a dielectric layer 644 is formed over the semiconductor workpiece 102. The dielectric layer 644 may be formed by depositing the dielectric layer 644 over the semiconductor workpiece 102 by, for example a physical vapor deposition (PVD) process, a chemical vapor deposition (CVD) process, an atomic layer deposition (ALD) process, or some other suitable deposition or growth process.

Figure 21A:
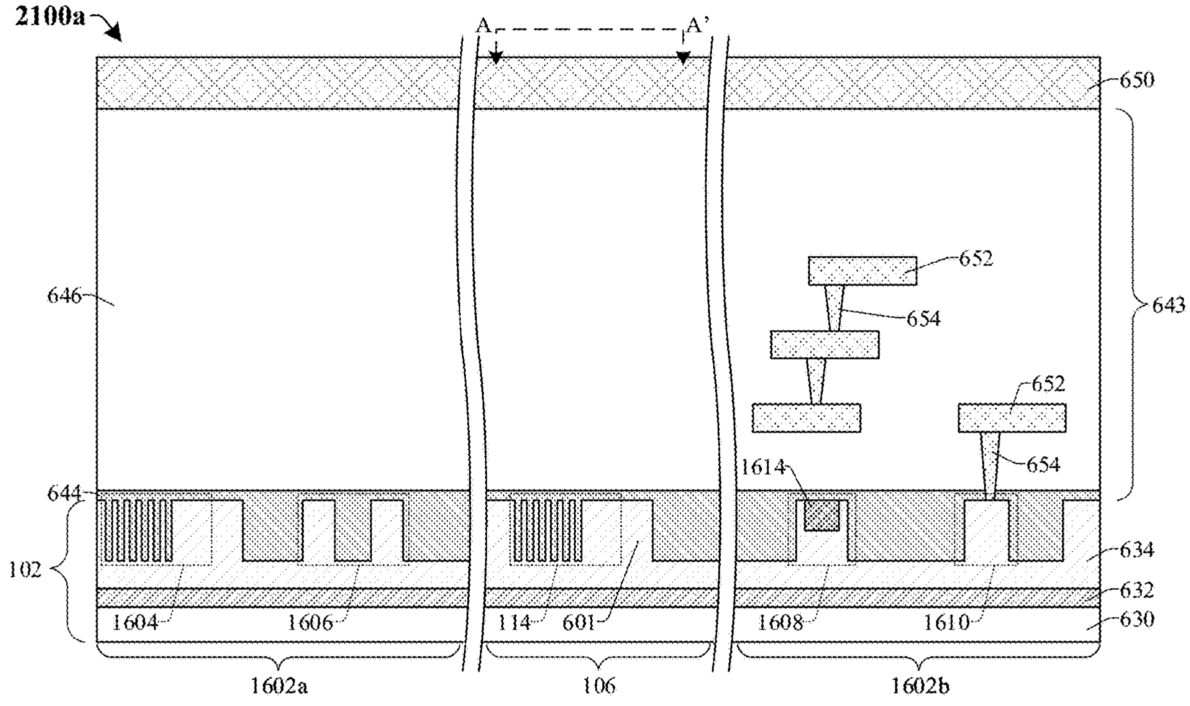
Figure 21B:
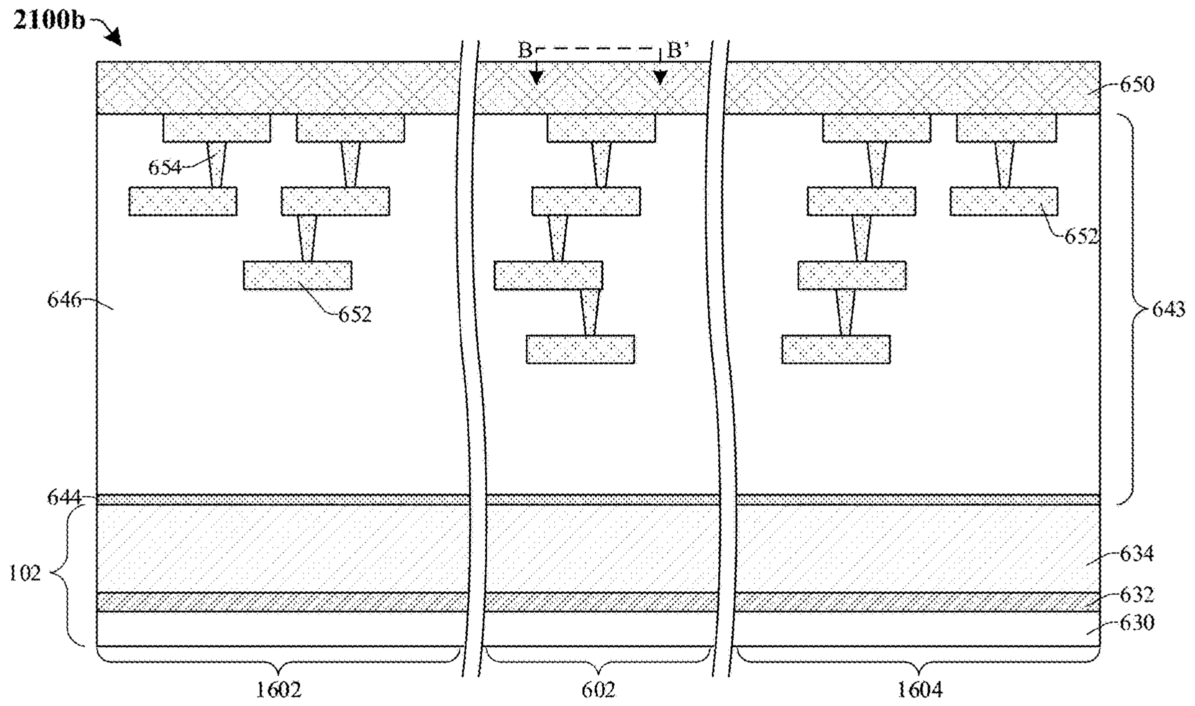
Figure 21C:
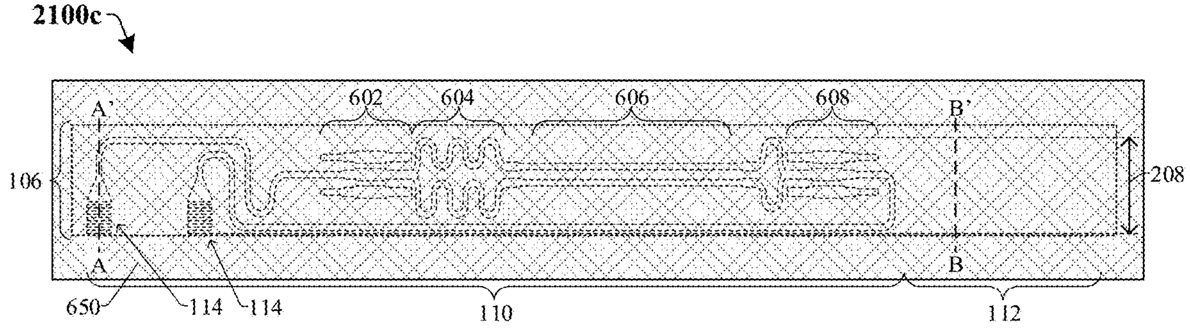

As shown in cross-sectional view 2100*a* of FIG. 21A, cross-sectional view 2100*b* of FIG. 21B, and top view 2100*c* of FIG. 21C, an interconnect structure 643 and a passivation structure 650 are formed over the semiconductor workpiece 102. The interconnect structure 643 comprises a plurality of conductive wires 652 and a plurality of conductive vias 654 disposed within an interconnect dielectric structure 646. The interconnect structure 643 may be formed by one or more patterning process(es), one or more deposition process(es), some other suitable fabrication process(es), or any combination of the foregoing. The passivation structure 650 may be formed by depositing the passivation structure 650 over the interconnect structure 643 by, for example a PVD process, a CVD process, an ALD process, or some other suitable deposition or growth process.

FIG. 21C illustrates the top view 2100*c* corresponding to the test line region 106 of the cross-sectional view 2100*a* of FIG. 21A and the cross-sectional view 2100*b* of FIG. 21B. A portion of the cross-sectional view 2100*a* of FIG. 21A is taken along line A-A' of the top view 2100*c* of FIG. 21C. A portion of the cross-sectional view 2100*b* of FIG. 21B is taken along line B-B' of the top view 2100*c* of FIG. 21C.

Figure 22A:
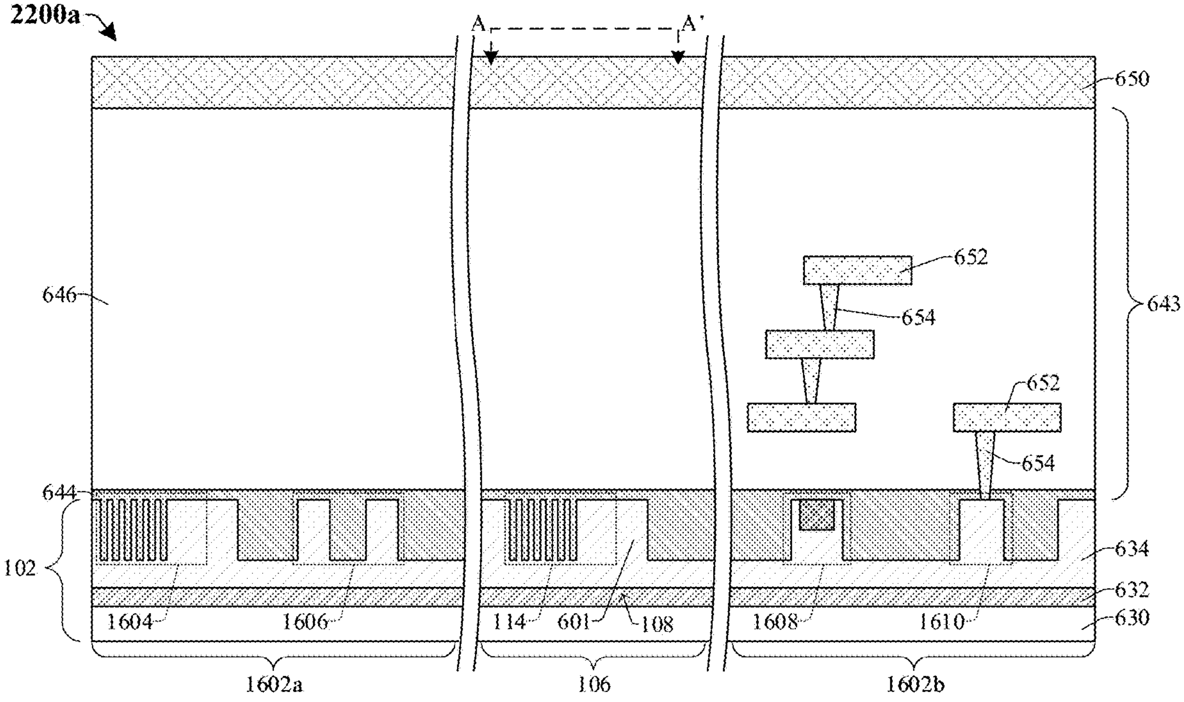
Figure 22B:
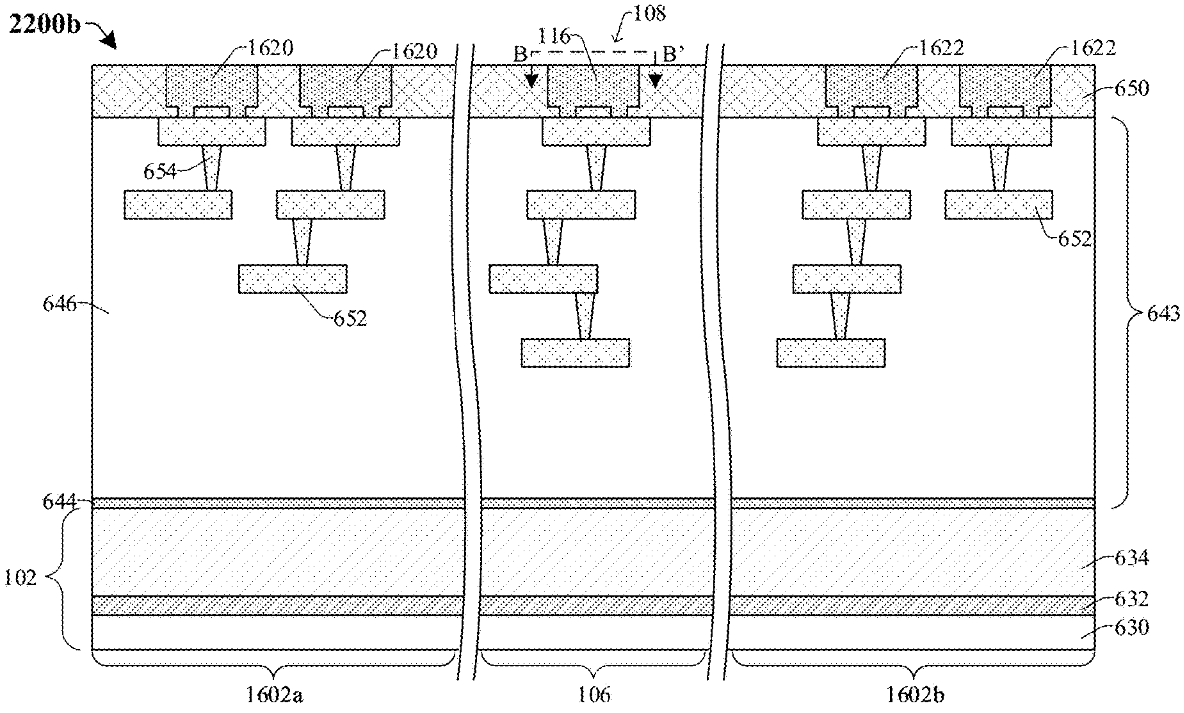
Figure 22C:
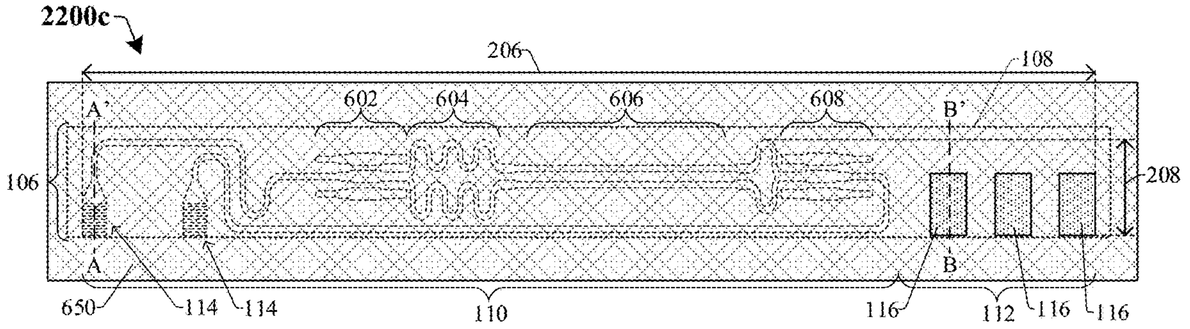

As shown in cross-sectional view 2200*a* of FIG. 22A, cross-sectional view 2200*b* of FIG. 22B, and top view 2200*c* of FIG. 22C, a first plurality of bond pads 1620 are formed within the first device region 1602*a*, a second plurality of bond pads 1622 are formed within the second device region 1602*b*, and a plurality of electrical I/O structures 116 are formed within the test line region 106 thereby forming a test line structure 108 in the test line region 106. In some embodiments, a process for forming the first and second plurality of bond pads 1620, 1622 and the plurality of electrical I/O structures 116 includes: forming a masking layer (not shown) over the passivation structure 650; performing an etching process (e.g., a dry etching process, a wet etching process, etc.) on the passivation structure 650 according to the masking layer to form a plurality of openings in the passivation structure 650; depositing (e.g., by CVD, PVD, sputtering, electroplating, electroless plating, etc.) a conductive material (e.g., titanium, platinum, gold, some other conductive material, or any combination of the foregoing) in the plurality of openings; and performing a planarization process (e.g., a chemical mechanical planarization (CMP) process) on the conductive material. It will be appreciated that while the test line structure 108 is formed as being configured as illustrated and/or described in FIGS. 16A-16C, the test line structure 108 may be formed to be configured as illustrated and/or described in FIG. 11, 13A-C, or 15A-B.

FIG. 22C illustrates the top view 2200*c* corresponding to the test line region 106 of the cross-sectional view 2200*a* of FIG. 22A and the cross-sectional view 2200*b* of FIG. 21B. A portion of the cross-sectional view 2200*a* of FIG. 22A is taken along line A-A' of the top view 2200*c* of FIG. 22C. A portion of the cross-sectional view 2200*b* of FIG. 22B is taken along line B-B' of the top view 2200*c* of FIG. 22C.

Figure 23A:
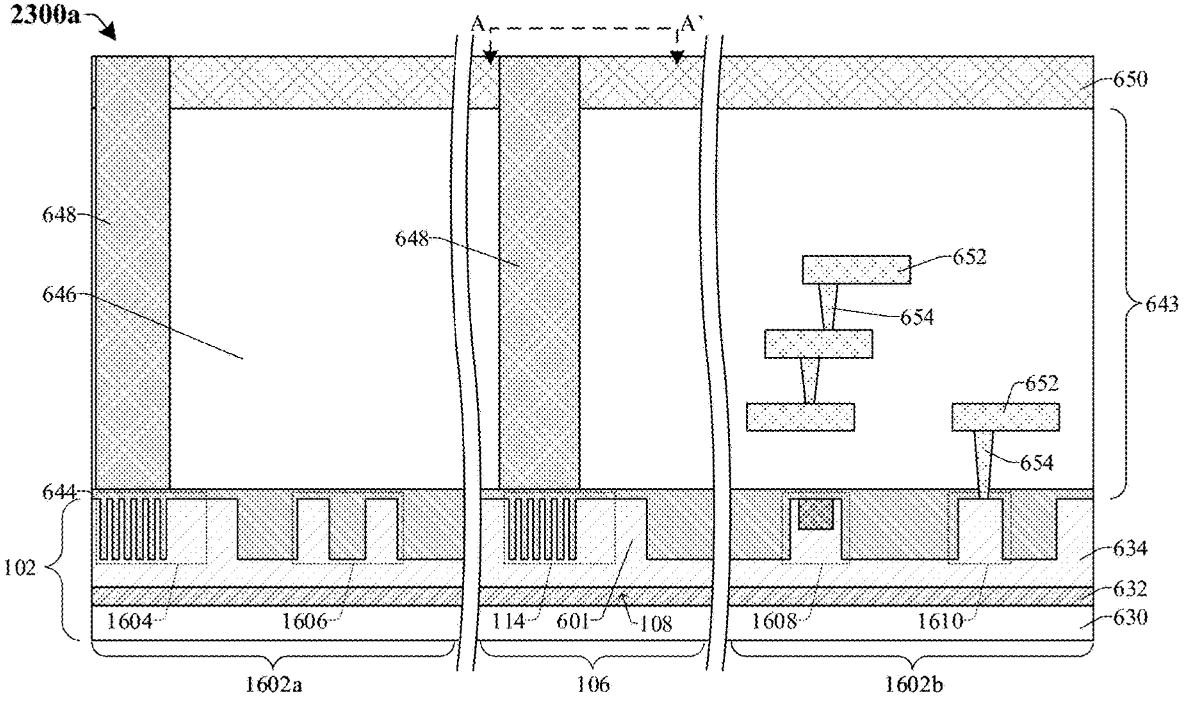
Figure 23B:
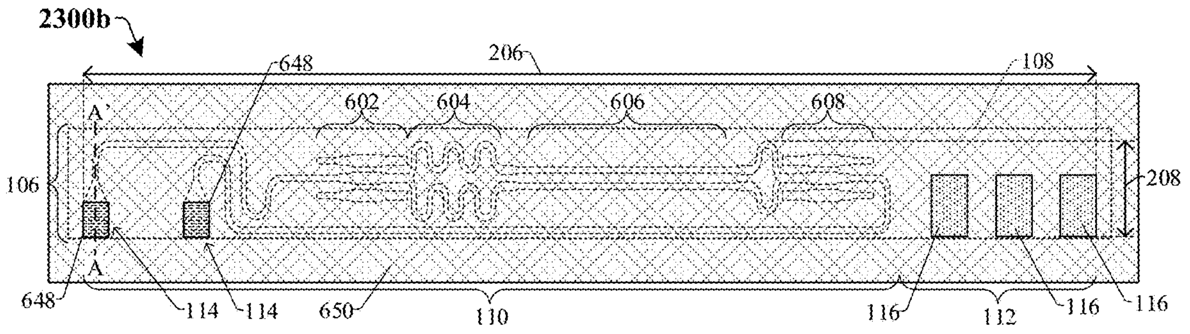

As shown in cross-sectional view 2300*a* of FIG. 23A and top view 2300*b* of FIG. 23B, a plurality of optical I/O channels 648 are formed in the interconnect structure 643 and the passivation structure 650. In some embodiments, a process for forming the optical I/O channels 648 includes: etching the passivation structure 650 and interconnect dielectric structure 646 to form a plurality of openings extending through the passivation structure 650 and the interconnect dielectric structure 646; and depositing an optical channel material in the plurality of openings.

FIG. 23B illustrates the top view 2300*b* corresponding to the test line region 106 of the cross-sectional view 2300*a* of FIG. 23A. A portion of the cross-sectional view 2300*a* of FIG. 23A is taken along line A-A' of the top view 2300*b* of FIG. 23B.

Figure 24:
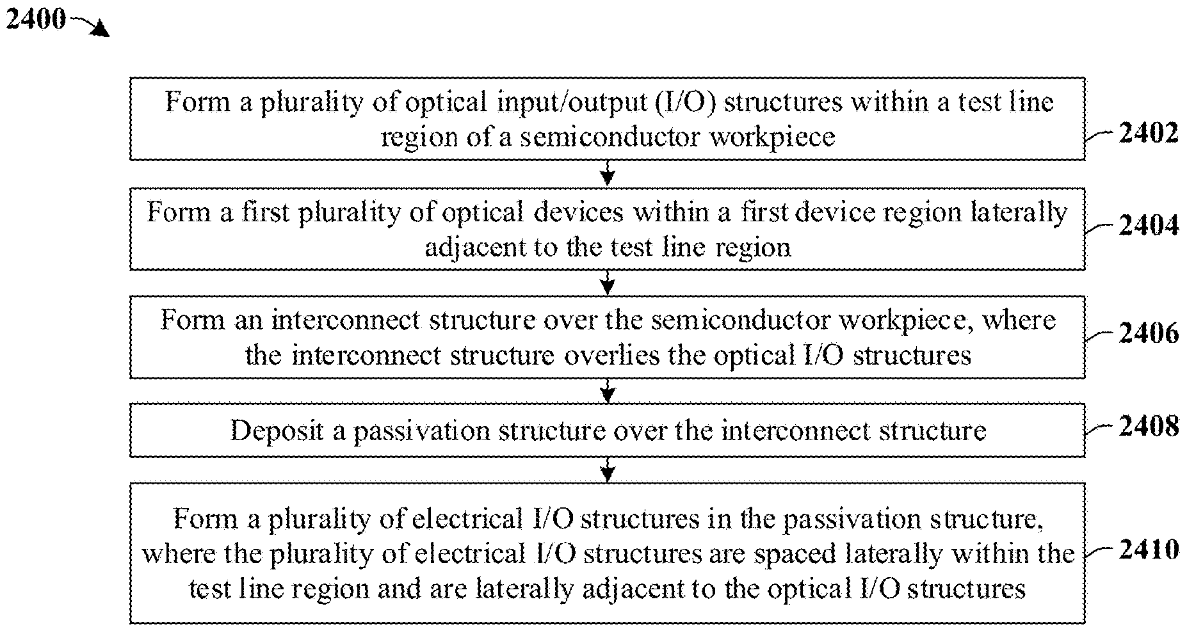
FIG. 24 illustrates a flow diagram of some embodiments of a method for forming an integrated chip including a test line structure comprising a plurality of optical I/O structures and a plurality of electrical I/O structures.

FIG. 24 illustrates a flow diagram 2400 of some embodiments of a method for forming an integrated chip including a test line structure comprising a plurality of optical I/O structures and a plurality of electrical I/O structures. Although the method illustrates and/or describes a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2402, a plurality of optical input/output structures are formed within a test line region of a semiconductor workpiece. FIGS. 19A and 19B illustrate various views corresponding to some embodiments of act 2402.

At act 2404, a first plurality of optical devices are formed within a first device region laterally adjacent to the test line region. FIGS. 19A and 19B illustrate various views corresponding to some embodiments of act 2404.

At act 2406, an interconnect structure is formed over the semiconductor workpiece, where the interconnect structure overlies the optical I/O structures. FIGS. 21A-C illustrate various views corresponding to some embodiments of act 2406.

At act 2408, a passivation structure is deposited over the interconnect structure. FIGS. 21A-C illustrate various views corresponding to some embodiments of act 2408.

At act 2410, a plurality of electrical I/O structures are formed in the passivation structure. The plurality of electrical I/O structures are spaced laterally within the test line region and are laterally adjacent to the optical I/O structures. FIGS. 22A-C illustrate various views corresponding to some embodiments of act 2410.

Accordingly, in some embodiments, the present disclosure relates to an integrated chip having a test line structure that comprises a plurality of optical I/O structures and a plurality of electrical I/O structures disposed within a test line region.

In some embodiments, the present application provides an integrated chip including a semiconductor workpiece; a test line structure disposed on the semiconductor workpiece, wherein the test line structure includes a plurality of optical input/output (I/O) structures disposed within and/or on the semiconductor workpiece; and a plurality of electrical I/O structures on the semiconductor workpiece, wherein the plurality of optical I/O structures and the plurality of electric I/O structures are laterally spaced from one another along a line extending in a first direction.

In some embodiments, the present application provides an integrated chip including a first device region disposed on a semiconductor workpiece and comprising a first plurality of optical devices; a second device region disposed on the semiconductor workpiece and comprising a second plurality of optical devices, wherein the first device region is next to the second device region; and a test line structure disposed within a test line region spaced laterally between the first and second device regions, wherein the test line structure comprises a plurality of optical input/output (I/O) structures and a plurality of electrical I/O structures adjacent to the plurality of optical I/O structures, wherein the plurality of electrical I/O structures are vertically offset from the plurality of electrical I/O structures.

In some embodiments, the present application provides a method for forming an integrated chip, including forming a plurality of optical input/output (I/O) structures within a test line region of a semiconductor workpiece; forming an interconnect structure over the semiconductor workpiece; and forming a plurality of electrical I/O structures on the interconnect structure and within the test line region, wherein the plurality of electrical I/O structures are laterally adjacent to the plurality of optical I/O structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:

forming a plurality of optical input/output (I/O) structures within a test line region of a semiconductor workpiece, wherein the semiconductor workpiece comprises a base substrate separated from an active layer by an insulator structure, wherein forming the plurality of optical I/O structures comprises etching the active layer to form a plurality of grating coupler elements and grating taper structure within the active layer;

forming an interconnect structure over the semiconductor workpiece; and forming a plurality of electrical I/O structures on the interconnect structure and within the test line region, wherein the plurality of electrical I/O structures are laterally adjacent to the plurality of optical I/O structures.

2. The method of claim 1, wherein forming the plurality of electrical I/O structures comprises:

depositing a passivation structure over the interconnect structure;

etching the passivation structure to form a plurality of openings in the passivation structure;

depositing a conductive material within the plurality of openings; and performing a planarization process on the conductive material, wherein the plurality of electrical I/O structures comprise a first material and the plurality of optical I/O structures comprise a second material different from the first material.

3. The method of claim 1, further comprising:

forming one or more optical devices within the test line region, wherein the one or more optical devices are spaced laterally between the plurality of optical I/O structures and the plurality of electrical I/O structures.

4. The method of claim 3, further comprising:

forming a first plurality of optical devices within a first device region laterally adjacent to the test line region, wherein the one or more optical devices in the test line region are formed concurrently with the first plurality of optical devices.

5. The method of claim 2, further comprising:

forming an optical I/O channel structure in the passivation structure and the interconnect structure, wherein the optical I/O channel structure overlies a first optical I/O structure in the plurality of optical I/O structures.

6. The method of claim 5, wherein forming the optical I/O channel structure comprises:

etching the passivation structure and a dielectric structure of the interconnect structure to form an opening over the first optical I/O structure; and depositing an optical channel material in the opening.

7. The method of claim 5, wherein the optical I/O channel structure is formed after forming the plurality of electrical I/O structures.

8. The method of claim 5, wherein a top surface of the optical I/O channel structure is aligned with a top surface of a first electrical I/O structure in the plurality of electrical I/O structures.

9. A method for forming an integrated chip, comprising:

performing an etching process on a semiconductor substrate to form a first optical test input/output (I/O) structure and a second optical test I/O structure in a semiconductor layer of the semiconductor substrate, wherein the semiconductor substrate comprises a base substrate and an insulator structure between the semiconductor layer and the base substrate, wherein the first and second optical test I/O structures are arranged in a test line region;

forming one or more optical test devices on the semiconductor layer and within the test line region, wherein the one or more optical test devices are optically coupled between the first optical test I/O structure and the second optical test I/O structure;

forming a plurality of first optical devices on the semiconductor layer and within a first device region adjacent to the test line region;

forming an interconnect structure over the semiconductor substrate, wherein the interconnect structure comprises a plurality of conductive interconnects arranged in a dielectric structure;

depositing a passivation structure over the interconnect structure; and forming a plurality of electrical I/O structures in the passivation structure and within the test line region, wherein a first lateral distance between the one or more optical test devices and a first electrical I/O structure in the plurality of electrical I/O structures is less than a second lateral distance between the first and second optical test I/O structures.

10. The method of claim 9, wherein the optical test devices and the first optical devices are formed at least in part by the etching process.

11. The method of claim 9, wherein the first optical test I/O structure is configured to receive an input optical test signal and provide the input optical test signal to the one or more optical test devices, wherein the one or more optical test devices are configured to generate an output optical test signal based on the input optical test signal and provide the output optical test signal to the second optical test I/O structure.

12. The method of claim 9, wherein centers of the electrical I/O structures are arranged along a line that intersects the first and second optical test I/O structures.

13. The method of claim 9, wherein the etching process forms an optical I/O structure in the first device region, wherein the optical I/O structure is optically coupled to the one or more of the first optical devices.

14. The method of claim 9, further comprising:

forming a test line ID structure on the semiconductor layer, wherein the test line ID structure is spaced laterally between the second optical test I/O structure and a first optical test device in the one or more optical test devices.

15. The method of claim 9, wherein the one or more optical test devices comprise a first waveguide, an optical splitter, an optical modulator, and a second waveguide, wherein the first waveguide is coupled between the first optical test I/O structure and the optical splitter, wherein the optical modulator is coupled between the optical splitter and the second waveguide.

16. A method for forming an integrated chip, comprising:

forming a plurality of first optical devices on a semiconductor substrate and within a first device region;

forming a plurality of second optical devices on the semiconductor substrate and within a second device region;

forming a plurality of optical input/out (I/O) structures on the semiconductor substrate and within a test line region spaced between the first device region and the second device region;

forming a plurality of optical test devices on the semiconductor substrate and within the test line region, wherein the plurality of optical test devices are optically coupled to one or more of the optical I/O structures, wherein the plurality of optical test devices are formed concurrently with the plurality of first optical devices and the plurality of second optical devices, wherein the plurality of optical test devices comprises a modulator having a first doped region;

depositing a dielectric structure over the semiconductor substrate;

forming a plurality of conductive wires and a plurality of conductive vias in the dielectric structure; and forming a plurality of electrical I/O structures on the dielectric structure and within the test line region, wherein a first electrical I/O structure in the plurality of electrical I/O structures is electrically coupled to the first doped region.

17. The method of claim 16, wherein the plurality of optical I/O structures, the plurality of optical test devices, and the plurality of electrical I/O structures are spaced laterally along a length of the test line region, wherein a width of the test line region is less than the length of the test line region, wherein the width is less than about 240 micrometers.

18. The method of claim 16, further comprising:

performing a wafer acceptance test on the plurality of optical test devices before performing a dicing process on the semiconductor substrate.

19. The method of claim 16, further comprising:

depositing a dielectric layer over the semiconductor substrate and around the first optical devices, the second optical devices, and the optical test devices, wherein the dielectric layer continuously laterally extends from a sidewall of an individual optical device in the first optical devices to a sidewall of an individual optical device in the optical test devices.

20. The method of claim 3, wherein, in a top view, at least portions of the plurality of optical I/O structures and the plurality of electrical I/O structures are collinear with at least one of the one or more optical devices, such that a straight line extending through the optical I/O structures and the electrical I/O structures passes through the at least one optical device.

* * * * *